United States Patent
Tan

(10) Patent No.: US 10,998,891 B2
(45) Date of Patent: May 4, 2021

(54) FREQUENCY CONVERTER BASED ON NON-LINEAR TRANSMISSION LINE INCLUDING DISPERSION CONTROL ELEMENTS

(71) Applicant: Oxford University Innovation Limited, Oxford (GB)

(72) Inventor: Boon Kok Tan, Oxford (GB)

(73) Assignee: Oxford University Innovation Limited, Botley (GB)

(*) Notice: Subject to any disclaimer, the term of this patent is extended or adjusted under 35 U.S.C. 154(b) by 0 days.

(21) Appl. No.: 16/640,670

(22) PCT Filed: Aug. 14, 2018

(86) PCT No.: PCT/GB2018/052311
§ 371 (c)(1),
(2) Date: Feb. 20, 2020

(87) PCT Pub. No.: WO2019/038518
PCT Pub. Date: Feb. 28, 2019

(65) Prior Publication Data
US 2020/0358430 A1 Nov. 12, 2020

(30) Foreign Application Priority Data
Aug. 22, 2017 (GB) ..................... 1713475

(51) Int. Cl.
H03K 5/00 (2006.01)
H03K 4/04 (2006.01)
(52) U.S. Cl.
CPC ........... *H03K 5/00006* (2013.01); *H03K 4/04* (2013.01)
(58) Field of Classification Search
None
See application file for complete search history.

(56) References Cited

U.S. PATENT DOCUMENTS 3,617,912 A 11/1971 Miller
7,164,526 B2 1/2007 Mckinstrie
(Continued)

FOREIGN PATENT DOCUMENTS

WO WO/2017/149319 9/2017

OTHER PUBLICATIONS

Eom et al., "A Wideband, Low-Noise Superconducting Amplifier with High Dynamic Range," arxiv.org, Cornell University Library, 201 Olin Library Cornell University Ithaca, NY 14853, Jan. 11, 2012, in 23 pages.
(Continued)

*Primary Examiner* — Cassandra F Cox
(74) *Attorney, Agent, or Firm* — Knobbe Martens Olson & Bear, LLP

(57) ABSTRACT

A frequency converter (1) for generating an output signal (5a) from an input signal (5), the output signal (5a) having different frequency than the input signal (5), the frequency converter (1) including: an input (7) for receiving an input signal (5); a transmission line (3) formed of a non-linear medium (3a), the medium (3a) arranged such that when the input signal (5) propagates along the line (3), one or more harmonics (5a,5b) of the input signal (5) are generated; a plurality of dispersion control elements (13), the dispersion control elements (13) arranged to control the dispersion relationship of the medium (3a), to phase match the input signal (5) and the one or more harmonics (5a,5b), such that energy is transferred from the input signal (5) to the one or more harmonics (5a,5b); and an output (9) for providing the one or more harmonics (5a, 5b) as an output signal.

20 Claims, 12 Drawing Sheets

(56) References Cited

U.S. PATENT DOCUMENTS

| | | |
|---|---|---|
| 8,878,626 B2 | 11/2014 | Zmuidzinas |
| 2005/0146780 A1 | 7/2005 | Mckinstrie |
| 2008/0130097 A1 | 6/2008 | Mckinstrie |
| 2010/0103305 A1 | 4/2010 | Suda et al. |
| 2012/0098594 A1 | 4/2012 | Zmuidzinas |
| 2013/0207725 A1 | 8/2013 | Afshari |
| 2015/0241481 A1 | 8/2015 | Narla et al. |
| 2017/0091648 A1 | 3/2017 | Abdo |
| 2019/0074801 A1* | 3/2019 | Tan .................... H03F 3/54 |

OTHER PUBLICATIONS

Tan, et al., "Design of a Uniplanar Resonance Phase-Matched Josephson Travelling-Wave Parametric Amplifier," 10th UK, Europe, China Millimeter Waves and Terahertz Technology Workshop, 2017.

Ho Eom, et al., "A wideband, low-noise superconducting amplifier with high dynamic range," Nature Physics, Jul. 8, 2012.

Search Report under Section 17(5) in Great Britain Application No. GB1713475.0, dated Feb. 19, 2018.

Wang et al., "1/f Noise in High Current Density NbN/AlN/NbN Tunnel Junctions," IEEE Transactions on Applied Superconductivity, Mar. 2001.

O'Brien et al., "Resonantly phase-matched Josephson junction traveling wave parametric amplifier," Phys. Rev. Lett. 113, 157001, source: arXiv:1406.2346v1, 2014.

Macklin, et al., "A near-quantum-limited Josephson traveling-wave parametric amplifier," Science, 350 (6258), 307-310, 2015.

Yaakobi, et al., "Parametric amplification in Josephson junction embedded transmission lines," Physical Review B, 2013.

O'Brien et al., "Resonantly phase-matched Josephson junction traveling wave parametric amplifier," Phys. Rev. Lett. 113, 157001-1-157001-5, Oct. 6, 2014.

PCT Search Report and Written Opinion from corresponding International Patent Application No. PCT/GB2018/052311, dated Jan. 17, 2019.

Kamal et al., "Signal-to-pump back action and self-oscillation in double-pump Josephson parametric amplifier," Physical Review B, Condensed Matter and Materials Physics, vol. 79, No. 18, May 2, 2009, in 26 pages.

Li et al., "Design of an Ultra-wideband Transition from Double-sided Microstrip to Parallel-strip line for Balance-type Antenna", *Rec. Adv. in Elec. Eng.*, 2018, vol. 11, p. 76-79.

* cited by examiner

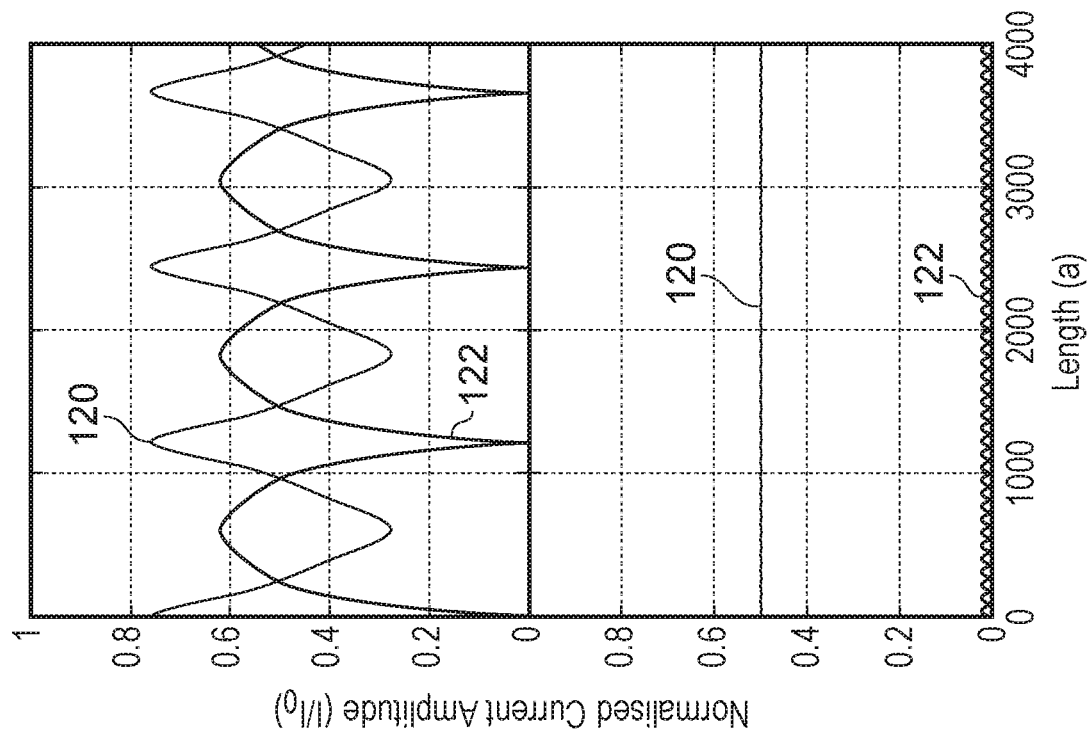
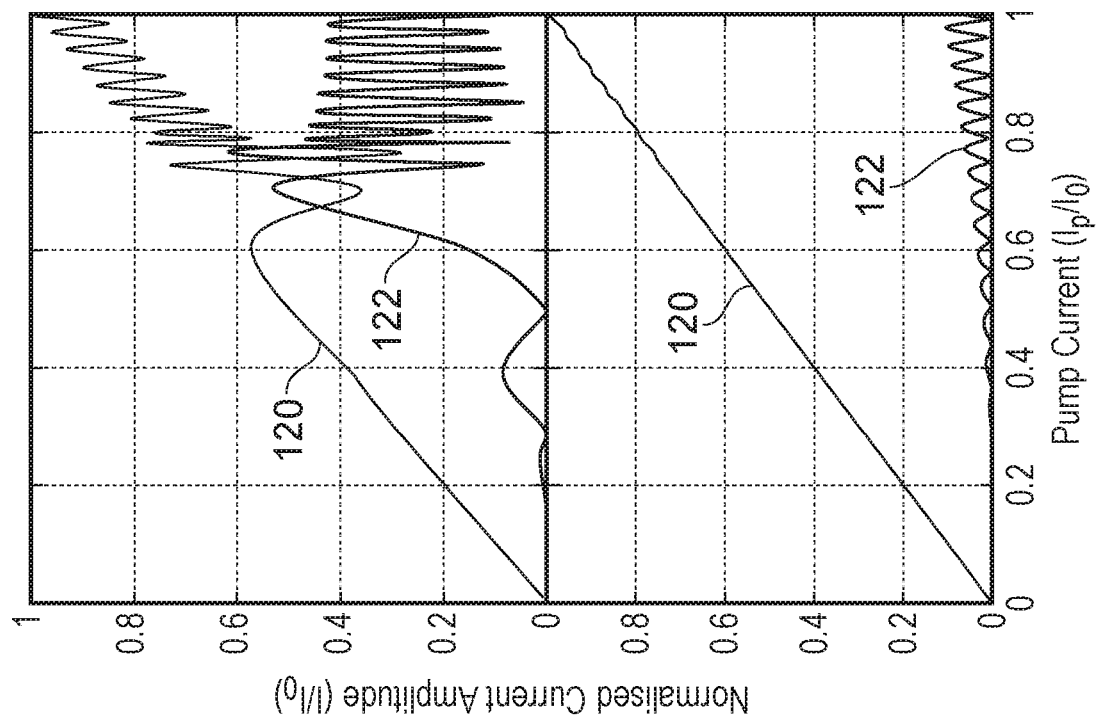
FIG. 5A
FIG. 5B

FREQUENCY CONVERTER BASED ON NON-LINEAR TRANSMISSION LINE INCLUDING DISPERSION CONTROL ELEMENTS

The present invention relates to a frequency converter.

Generation of signals at high frequency, with cleanly defined spectral components, high output power and low noise is important for many applications including telecommunications and signal processing. For example, such signals may be useful as a local oscillator in heterodyne receivers, for frequencies from radio waves to THz.

Typically, signals can be generated at a range of frequencies using a natural source, such as an oscillating crystal or an optical laser. These sources rely on a material that resonates at a particular frequency. To provide a range of frequencies, the output of these sources can be varied using techniques to change the resonant frequency, such as stretching the resonance medium or making some other alteration to the resonance medium (e.g. quantum cascade lasers). The frequencies that can be produced by this method are limited by the natural source.

An alternative way to generate a range of frequencies is to up- or down-convert the frequency of the signal provided by the natural source. This can be done in various ways. For example, this can be done electronically through semiconductor diodes housed in waveguide structures, or through beating two optical sources. These processes rely on frequency mixing in a non-linear medium to achieve frequency conversion.

According to a first aspect of the invention, there is provided a frequency converter for generating an output signal from an input signal, the output signal having different frequency than the input signal, the frequency converter including: an input for receiving an input signal; a transmission line formed of a non-linear medium, the medium arranged such that when the input signal propagates along the line, one or more harmonics of the input signal are generated; a plurality of dispersion control elements, the dispersion control elements arranged to control the dispersion relationship of the medium, to phase match the input signal and the one or more harmonics, such that energy is transferred from the input signal to the one or more harmonics; and an output for providing the one or more harmonics as an output signal.

The converter provides an output signal with cleanly defined spectral components and low noise signal, with high conversion efficiency.

The input signal and the one or more harmonics may be phase matched such that the phase difference between the signals is kept at zero or substantially zero. A low phase difference ensures that the output signal is generated and amplified with high conversion efficiency, as the power transfer to the harmonic from the input signal is maximised.

The input signal and the one or more harmonics may be phase matched when the frequency of the input signal is substantially at a first frequency or a second frequency.

The dispersion control elements may have a low Q-factor. The signal and the one or more harmonics may be phase matched when the frequency of the input signal is between the first frequency and the second frequency. The use of low Q-factor dispersion control elements provides for broadband operation.

The first frequency may be a fundamental resonance of the dispersion control elements, and the second frequency may be a result of a harmonic of the fundamental resonance. The second frequency may be one third of the first frequency.

Alternatively, the plurality of dispersion control elements may include a first set of dispersion control elements having a first fundamental frequency, and a second set of dispersion control elements having a second fundamental frequency, and the first frequency may be the fundamental resonance of the first set of dispersion control elements, and the second frequency may be the fundamental resonance of the second set of dispersion control elements. The use of two different fundamental frequencies provides further extension of the operational bandwidth, improving the conversion efficiency. The fundamental frequency of the second set of dispersion control elements may be greater than the frequency of resonances generated by harmonics of the fundamental resonance of the first set of dispersion control elements.

The non-linear medium may have an intrinsic dispersion relationship, and the dispersion control elements may be arranged to alter the intrinsic dispersion relationship at one or more frequencies, and wherein at least one of the one or more frequencies may be at or near to a fundamental resonance of the dispersion control elements. The dispersion control elements may be arranged such that the dispersion relationship of the medium diverges from the intrinsic dispersion relationship at the one or more frequencies, such that there are stopbands in the dispersion relationship at the one or more frequencies. The dispersion control elements may be arranged such that the dispersion relationship varies asymptotically form the intrinsic dispersion relationship at the one or more frequencies.

The plurality of dispersion control elements may comprise a plurality of resonators. The plurality of dispersion control elements may comprise one or more sets of resonators, each set of resonators comprising a plurality of resonators having the same or substantially similar fundamental resonant frequency. Each resonator comprises a planar capacitor and a planar inductor, such that the frequency converter is formed in a single plane. The use of a planar structure makes the converter simple to implement.

A single input signal may be provided at the input.

The output signal may comprise one or more integer multiple harmonics of the input signal such that the frequency converter is an up converter. The transmission line may include filter means arranged to remove unwanted harmonics. Alternatively, the output signal may comprise one or more sub-harmonics of the input signal, such that the frequency converter is a down converter.

The medium may comprise a superconducting structure. The medium may comprise a plurality of superconducting tunnelling structures embedded along the transmission line. The superconducting tunnelling structures may have a critical frequency above which they are not superconducting, wherein the critical frequency may be approximately an order of magnitude or more higher than the one or more frequencies. The superconducting tunnelling structures may comprise Josephson junctions or SIS junctions.

The transmission line may be formed of a periodically repeating structure, formed of a number of unit cells. The number of unit cells may be arranged such that the amplitude of the one or more harmonics at the output is greater than the amplitude of the input signal. This allows generation of the chosen harmonic to be optimised.

The current of the input signal at the input may be arranged such that the amplitude of the one or more harmonics at the output is greater than the amplitude of the input signal. This allows generation of the chosen harmonic to be optimised.

According to a second aspect of the invention, there is provided a frequency converter including: a first frequency converter according to the first aspect, wherein the first frequency converter is arranged to convert input signals in a first range to output signals in a second range; and a second frequency converter including: a second input for receiving an input signal in the second range; a second transmission line formed of a non-linear medium; a plurality of second dispersion control elements, the second dispersion control elements arranged to control the dispersion relationship of the medium of the second transmission line, to phase match two or more signals propagating down the second transmission line; and a second output for providing one or more signals as an output, wherein the output signal of the first frequency converter is provided as the input signal of the second frequency converter.

The use of a series of converters allows for a broadband source to be converted to high frequency signals.

The medium of the second transmission line may be arranged such that when the output signal of the first transmission line propagates along the second transmission line, one or more harmonics of the output signal of the first transmission are generated; and wherein the dispersion control elements may be arranged to phase match the output signal of the first transmission and the one or more harmonics of the output signal of the first transmission, such that energy is transferred from the of the output signal of the first transmission to the one or more harmonics of the output signal of the first transmission, such that the second frequency converter is arranged to convert signals in the second range to signals in a third range.

The relative operational bandwidth of the first frequency converter may be less than the relative operational bandwidth of the second frequency converter, and wherein the proportion of energy transferred to the third harmonic signal may be higher in the first frequency converter than the second frequency converter. This allows optimisation of the second converter in the series, to ensure optimal generation of the final signal.

The dispersion control elements may be arranged to phase match two or more harmonics of the input signal of the first transmission line, such that the second frequency converter is arranged to intermix signals in the second range to output new frequency components.

According to a third aspect of the intention, there is provided a method of generating an output signal from an input signal, the output signal having different frequency than the input signal, the method including: providing an input signal; propagating the signal down a transmission line formed of a non-linear medium, the medium arranged such that when the input signal propagates along the line, one or more harmonics of the input signal are generated; phase matching the input signal and the one or more harmonics, such that energy is transferred from the input signal to the one or more harmonics; and providing the one or more harmonics as an output signal.

The method provides a signal with cleanly defined spectral components, high output power and low noise signal.

The output signal may comprise one or more integer multiple harmonics of the input signal. Alternatively, the output signal may comprise one or more sub-harmonics of the input signal, such that the frequency converter is a down converter.

It will be appreciated that any of the features discussion in relation to a particular aspect of the invention may be applied to any other aspect.

Embodiments of the invention will now be described, by way of example only, with reference to the accompanying drawings in which:

FIG. 1 schematically illustrates a frequency up-converter;

FIG. 2 schematically illustrates a first embodiment of the frequency up-converter of FIG. 1;

FIG. 3 schematically illustrates the amplitude of the third harmonic as a function of the length of a transmission line;

FIG. 5A shows the final amplitude of the input signal and third harmonic as a function of the initial amplitude of the input signal, for the transmission line having phase difference shown in FIG. 4A;

FIG. 5B shows the final amplitude of the input signal and third harmonic as a function of the length of the transmission line, for the transmission line having phase difference shown in FIG. 4A;

Figure 10A:
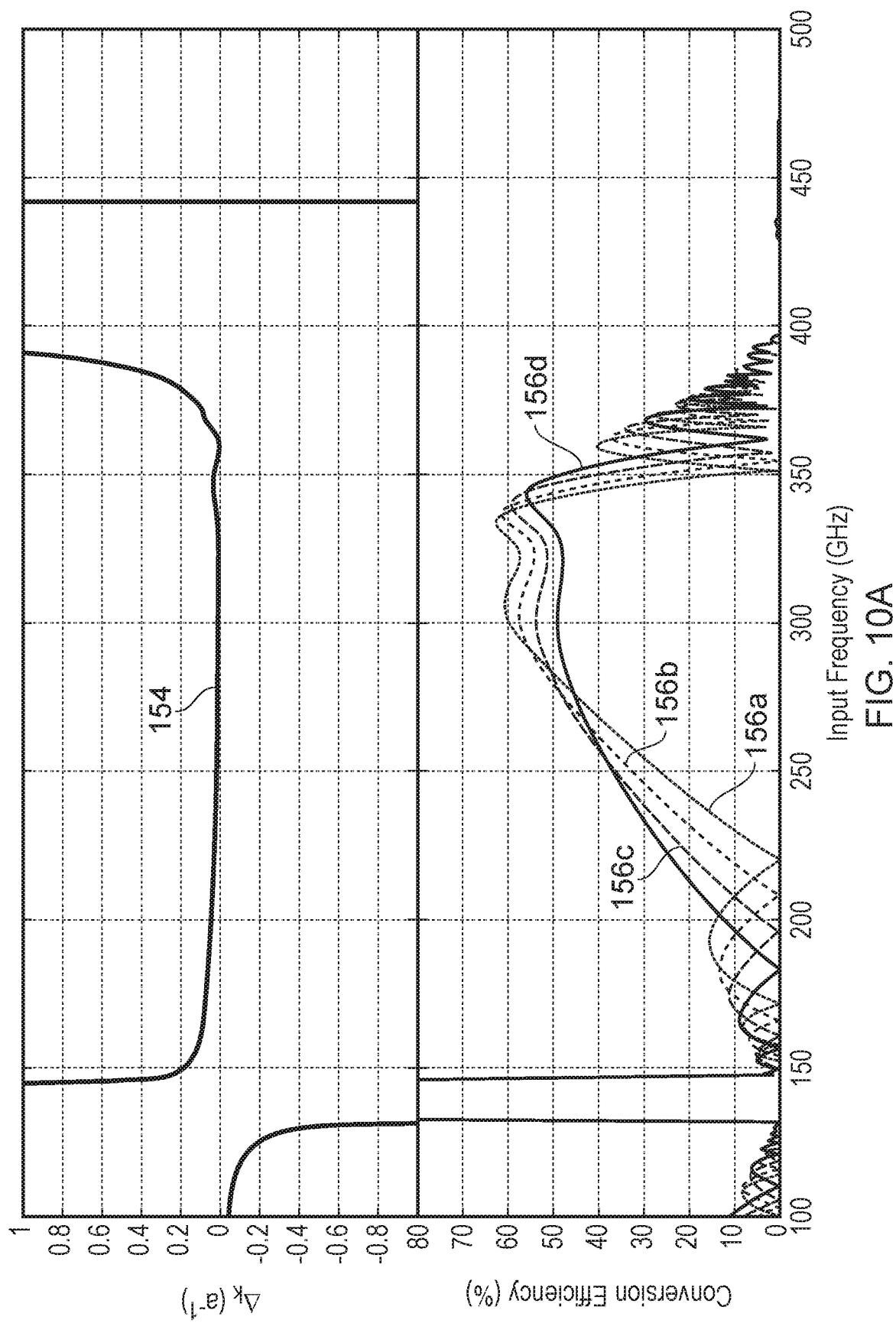
FIG. 10A shows the phase difference between an input signal and the third harmonic of the input signal, and the conversion efficiency from the input signal to the third harmonic, as a function of the frequency of the input signal, for a fifth example of a transmission line.
Figure 10B:
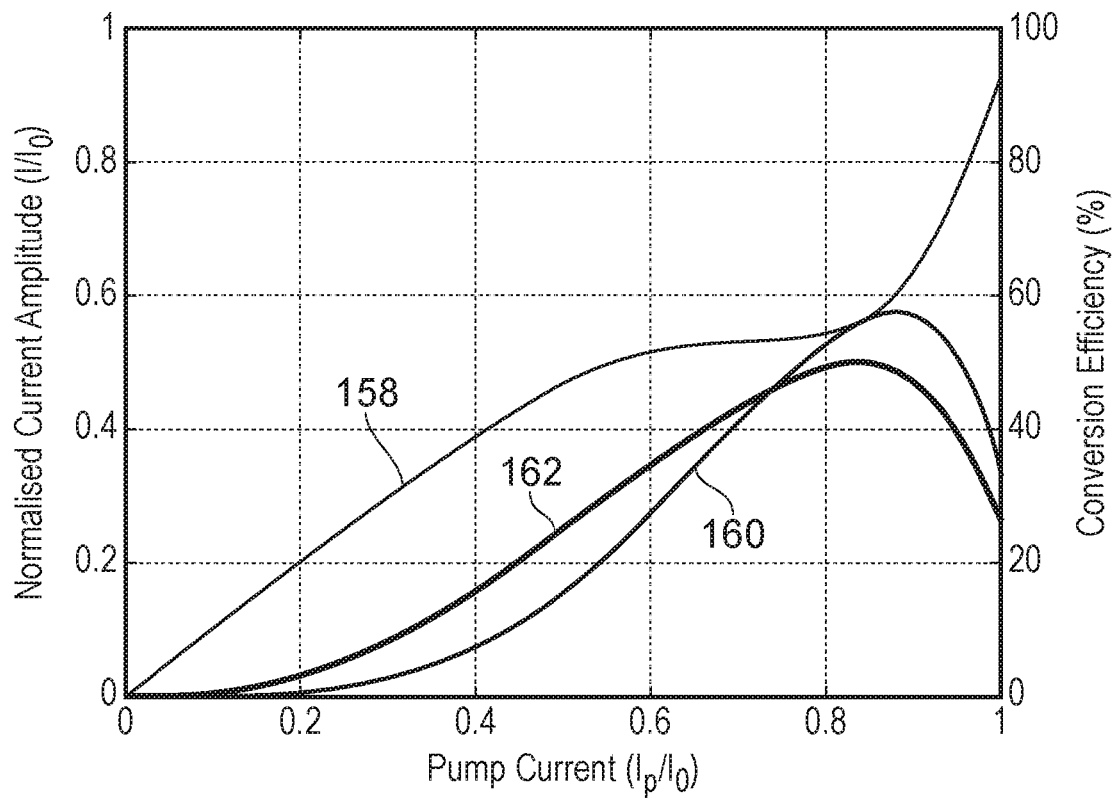
Figure 10C:
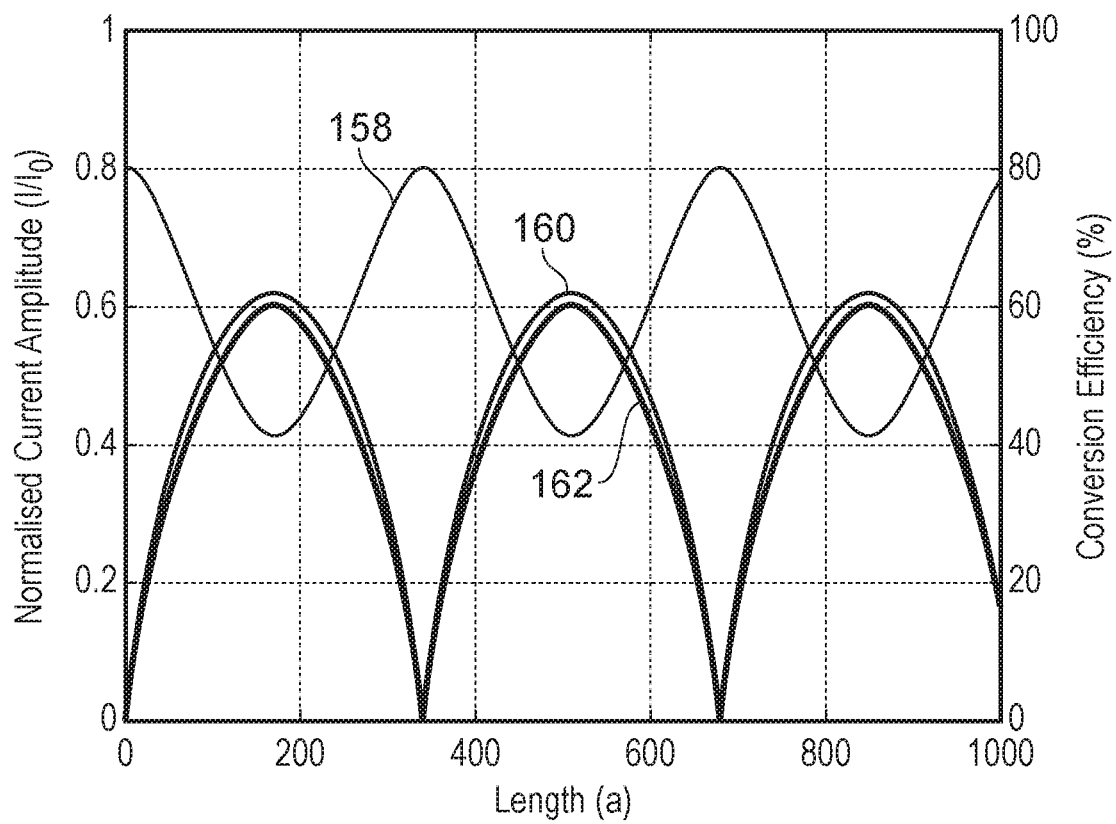

FIG. 10B shows the final amplitude of the input signal and third harmonic, and the conversion efficiency from the input signal to the third harmonic, as a function of the initial amplitude of the input signal, for the transmission line having phase difference shown in FIG. 10A; and FIG. 10C shows the final amplitude of the input signal and third harmonic, and the conversion efficiency from the input signal to the third harmonic, as a function of the length of the transmission line, for the transmission line having phase difference shown in FIG. 10A.

Figure 1:
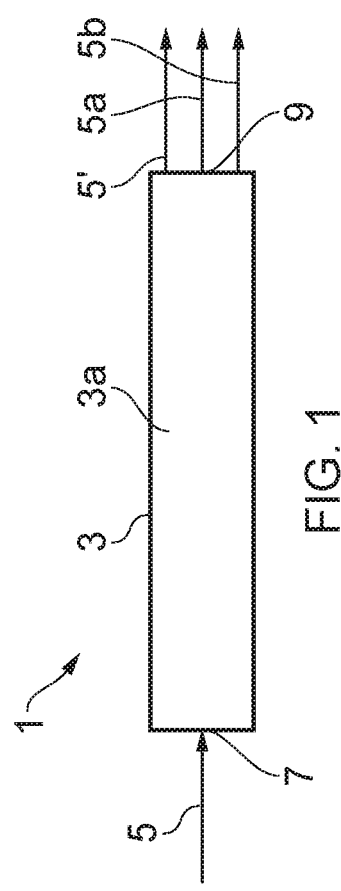

FIG. 1 schematically illustrates a frequency up-converter 1. The up-converter 1 is formed by a transmission line 3 composed of a non-linear medium 3a.

Typically, a transmission line 3 formed in this way is used as a travelling wave parametric amplifier. In a parametric amplifier, an input signal to be amplified is mixed with one or more pump signals, through a three or four wave mixing process. Energy is transferred from the pump(s) to the input signal, to amplify the input signal. The mixing process also generates an idler signal, such that the amplifier can be used as a frequency converter.

In a three wave mixing process, with a single pump, the frequency of the idler signal the difference between the frequency of the input signal and twice the frequency of the pump signal. In a four wave mixing process, with two pumps, the frequency of the idler signal is the difference between the frequency of the input signal and the sum of the frequencies of the pump signals.

In the up-converter 1 shown in FIG. 1, a single input signal 5, a pump wave, is provided at an input 7. There is only one signal 5 at the input 7. There is no signal to be amplified, and no additional pump signals. As the signal 5 propagates down the length of the transmission line 3 a number of signals 5a,b are generated. The generated signals 5a,b are harmonics of the input signal 5. The pump signal 5' and the harmonics 5a,b are provided at an output 9.

Depending on the type of medium, the frequencies of the additional generated signals 5a,b may be the odd numbered harmonics 5a,b of the input signal 5 only, the even numbered harmonics 5a,b of the input signal 5 only, or both odd and even harmonics. In the following, it will be assumed that the non-linear medium 3a is such that only odd harmonics are generated. However, it will be apparent that any type of non-linear medium could be used.

In the example of FIG. 1, a third harmonic 5a and fifth harmonic 5b are shown, however, it will be appreciated that any number of odd harmonics may be generated. The higher order harmonics typically have lower amplitude.

By using the third harmonic 5a or fifth harmonic 5b at the output 9, the transmission line 3 provides an up-converter 1, or harmonic generator. The majority of the output power of the up-converter 1 is in the input signal 5 and its harmonics 5a,b. This is because the mixing between the signals in the line (the input signal 5 and its harmonics 5a,b) is limited, and so any other signal components are sufficiently low amplitude such as to be negligible. The spread of the output signal is also low. Therefore, the output of the up-converter 1 is considered to have cleanly defined spectral components.

In one example, the third harmonic is used, and the transmission line 3 is a frequency tripler. In this case, the output 9 may include a filter to filter the input signal 5' and any other harmonics 5b.

The non-linear medium 3a provides non-linear interaction between signals carried in the medium 3a (for example the input pump signal 5 and the third harmonic 5a). Any phase difference between the signals increases as the signals propagate down a transmission line 3. As will be discussed in more detail below, the conversion of the input pump wave 5 to the third harmonic 5a is dependent on the phase difference $\Delta_k$ between the pump wave 5 and the third harmonic 5a. The transmission line 3 includes a means to phase match the signals as they propagate down the line 3.

According to an example embodiment, the transmission line 3 is formed from a periodic structure having a plurality of repeating unit cells 11 of identical structure. The unit cells 11 are connected in series. It will be appreciated that the transmission line 3 can contain any number of unit cells 11. For example, the transmission line 3 may be composed of one, tens, hundreds, thousands or more unit cells 11.

Figure 2:
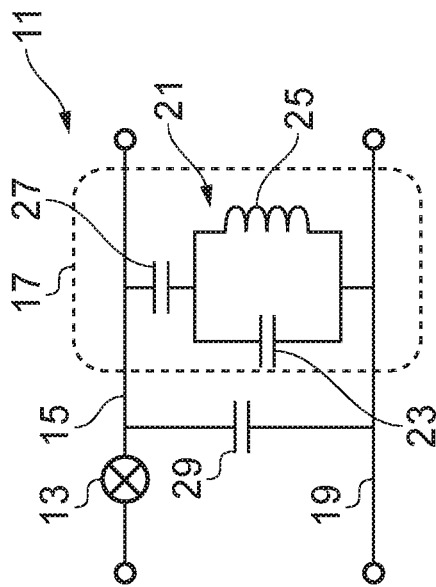

FIG. 2 shows the circuit diagram for one example of a unit cell 11. Each unit cell 11 includes a Josephson Junction 13 on a conducting line 15 and a shunt resonator 17, coupled between the conducting line 15 and a common earth 19 of the circuit. The resonator 17 is coupled after the Josephson junction 13.

The resonator 17 is formed of an LC resonator circuit 21, including a resonator capacitor 23, and a resonator inductor 25. The resonator 17 has a fundamental resonant frequency and is used to form a stopband in the dispersion relationship of the transmission line 3, at a stop frequency, the same as the frequency.

A shunt capacitor 29 is provided between the Josephson Junctions 13 and a common earth line 19 of the circuit. The shunt capacitor 29 controls the characteristic impedance of the transmission line 3. The coupling capacitance of the resonators 17 to the Josephson junctions is represented by a capacitor 27.

The fundamental resonant frequency of the resonator 17 can primarily be tuned by selection of the resonator capacitor 23, and the resonator inductor 25, although the coupling capacitance 27 can also have an effect.

The resonators 17 provide a stopband in the dispersion relation of the transmission line 3, at the fundamental resonant frequency of the resonator 17 (the dispersion relations shows the relationship between wave vector and frequency of signals in the media 3a). Away from the stopband, the dispersion relationship of the transmission line 3 follows the intrinsic dispersion relation of the media 3a (for example linear or quadratic). However, at the stopband, the dispersion relationship asymptotically tends to infinity. At the central frequency of the stopband (the fundamental resonant frequency of the resonator 17), there is infinite dispersion.

When the input pump signal 5 has a frequency near but not at the central frequency of the stopband, the non-linear dispersion of the input pump signal 5 ensures that the total phase mismatch between the input pump signal 5 and at least one of the harmonics 5a,b is zero or close to zero. As the input pump signal 5 varies away from the central frequency of the stopband, the magnitude of the phase mismatch increases. When the input pump signal 5 is at the central frequency of the stopband, the input pump signal 5 cannot propagate down the transmission line, and there is no signal at the output 9.

By using the phase matching resonators 17, the phase difference between the input pump signal 5 and the third harmonic 5a can be kept at zero or close to zero, and the amplitude of the third harmonic signal 5a can be increased, to provide the frequency up converter 1, increasing the conversion efficiency to the third harmonic 5a.

Using a first principles model for the non-linear dynamics in the transmission line 3, and by making the ansatz that the solutions are travelling waves, together with the slowly varying envelope approximation, a set of coupled equations which described the energy transfer from the input pump signal 5 and the third harmonic 5a can be obtained.

The non-linear wave equation for a transmission line 3 formed of Josephson Junctions 13 connected in series is given by equation (1):

$$C_0 \frac{\partial^2 \phi}{\partial t^2} - \frac{a^2}{L} \frac{\partial^2 \phi}{\partial x^2} - C_j a^2 \frac{\partial^4 \phi}{\partial x^2 \partial t^2} = \frac{a^4}{2I_0^2 L^3} \frac{\partial^2 \phi}{\partial x^2} \left(\frac{\partial \phi}{\partial x}\right)^2 \tag{1}$$

Where $C_0$ is the shunt capacitance 29 and $C_j$ is the capacitance of the Josephson junction 13, L is the inductance of the Josephson junction 13, and a is the length of unit cells 11.

An approximation of the solution is given by equation (2), where $A_p$ is the amplitude of the input pump signal 5 and $A_3$ the amplitude of the third harmonic signal 5a, $k_p$ is the wave vector of the input pump signal 5, and $k_3$ is the wavevector of the third harmonic signal 5a and $\omega_p$ is the angular frequency of the input pump signal 5 and $\omega_3$ is the angular frequency of the third harmonic signal 5a. C.C. is the complex conjugate of the first two expressions in the equation.

$$\phi = \frac{1}{2}[A_p(x)e^{i(k_p x + \omega_p t)} + A_3(x)e^{i(k_3 x + \omega_3 t)} + c.c.] \tag{2}$$

It is assumed that the second derivatives of the slowly varying amplitude are neglected using the approximation of equation (3a), and the first derivatives of the slowly varying amplitude on the right side of the non-linear wave equation are neglected using the approximation of equation 3b. The wavevector is also defined as in equation (3c). In equations (3a) to (3c) m="p" for the input pump signal 5 and "3" for the third harmonic signal 5a.

$$\left|\frac{d^2 A_m}{dx^2}\right| \ll \left|k_m \frac{dA_m}{dx}\right| \tag{3a}$$

$$\left|\frac{dA_m}{dx}\right| \ll |k_m A_m| \tag{3b}$$

$$k_m = \frac{\omega_m \sqrt{C_0 L}}{a\sqrt{1 - C_j L \omega_m^2}} \tag{3c}$$

Therefore, based on the assumptions and definitions in equations (3a) to (3c), equation (1) can be simplified to:

$$\frac{-iC_0 \omega_m^2}{k_m} \frac{\partial A_m(x)}{\partial x} e^{i(k_m x + \omega_m t)} = \frac{a^4}{2I_0^2 L^3} \frac{\partial^2 \phi}{\partial x^2}\left(\frac{\partial \phi}{\partial x}\right)^2 \tag{4}$$

When equation (2) is substituted into equation (4), and the terms that oscillate at the frequency of the input pump signal 5 and the third harmonic signal 5a are separated out, the coupled equations for the input pump signal 5 and the third harmonic signal 5a are given by equations (5a) and (5b):

$$\frac{\partial A_p(x)}{\partial x} - \frac{ia^4 k_p^3}{16C_0 I_0^2 L^3 \omega_p^2}[k_p^2 A_p(x)^2 A_p^*(x) + k_3(2k_p - k_3)A_p^{*2}(x)A_3(x)e^{-i\Delta k_L x}] = 0 \tag{5a}$$

$$\frac{\partial A_3(x)}{\partial x} - i\frac{a^4 k_p^2 k_3}{16C_0 I_0^2 L^3 \omega_3^2}[2k_3^2 A_p A_p^* A_3 - k_p^2 A_p^3 e^{i\Delta k_L x}] = 0 \tag{5b}$$

If $\Delta k_L$ is as defined in equation (6a), equations, and coupling coefficients $\alpha_{p1}$, $\alpha_{p2}$, $\alpha_{31}$, $\alpha_{32}$ are as defined by equations (6b) and (6c), then equations (5a) and (5b) can be simplified to equations (7a) and (7b):

$$\Delta k_L = 3k_p - k_3 \tag{6a}$$

$$\alpha_{p1} = \frac{a^4 k_p^5}{16C_{0,p}\omega_p^2 I_0^2 L^3}, \quad \alpha_{p2} = \frac{a^4 k_p^3 k_3(2k_p - k_3)}{16C_{0,p}\omega_p^2 I_0^2 L^3} \tag{6b}$$

$$\alpha_{31} = \frac{a^4 k_p^2 k_3^3}{8C_{0,3}\omega_3^2 I_0^2 L^3}, \quad \alpha_{32} = \frac{a^4 k_p^4 k_3}{16C_{0,3}\omega_3^2 I_0^2 L^3} \tag{6c}$$

$$\frac{\partial A_p(x)}{\partial x} - i\alpha_{p1} A_p(x)^2 A_p^*(x) - i\alpha_{p2} A_p^{*2}(x) A_3(x) e^{-i\Delta k_L x} = 0 \tag{7a}$$

$$\frac{\partial A_3(x)}{\partial x} - i\alpha_{31} A_p A_p^* A_3 + i\alpha_{32} A_p^3 e^{i\Delta k_L x} = 0 \tag{7b}$$

Equations (7a) and (7b) can solved to give equations (9a) and (9b) by making the substitutions shown in equations (8a) and (8d):

$$A_p(x) = a_p e^{e\phi_p x} \tag{8a}$$

$$A_3(x) = a_3 e^{i\phi_3 x} \tag{8b}$$

$$\phi_p = \alpha_{p1} a_p a_p^*, \quad \phi_3 = \alpha_{31} a_p a_p^* \tag{8c}$$

$$\Delta_k = \Delta k_L + 3\phi_p - \phi_3 \tag{8d}$$

$$\frac{\partial a_p}{\partial x} - i\alpha_{p2} a_p^{*2} a_3 e^{-i\Delta_k x} = 0 \tag{9a}$$

$$\frac{\partial a_3}{\partial x} - i\alpha_{32} a_p^3 e^{i\Delta_k x} = 0 \tag{9b}$$

Assuming that the third harmonic signal 5a is much weaker than the input pump signal 5 (the undepleted pump approximation) gives:

$$A_p(x) = a_p(0)e^{i\alpha_p x} \tag{10a}$$

$$A_3(x) = a_3(x)e^{i\alpha_3 x} \tag{10b}$$

$$\alpha_3 = \frac{a^4 k_p^4 k_3^2}{8C_{0,3}\omega_3^2 I_0^2 L^3} a_p(0)a_p^*(0) \tag{10c}$$

Based on this approximation, equations (9a) and (9b) can be solved analytically to give:

$$a_3 = \frac{(1 - e^{i\Delta'_k x})\kappa}{\Delta'_k} \quad (11)$$

$$\Delta'_k = 3k_p - k_3 + 3\alpha_p - \alpha_3 \quad (12a)$$

$$\alpha_p = \frac{a^4 k_p^5}{16 C_{0,p} \omega_p^2 I_0^2 L^3} a_p(0) a_p^*(0) \quad (12b)$$

$$\kappa = \frac{a^4 k_p^4 k_3^2}{16 C_{0,3} \omega_3^2 I_0^2 L^3} a_p^3(0) \quad (12c)$$

Equation (11) shows that the amplitude of the third harmonic signal 5a is periodically dependent on the length along the transmission line (x) and the length of the unit cell 11 (a). Equation (11) shows that the maximum amplitude of the third harmonic signal 5a is dependent on $\Delta'_k$.

Figure 3:
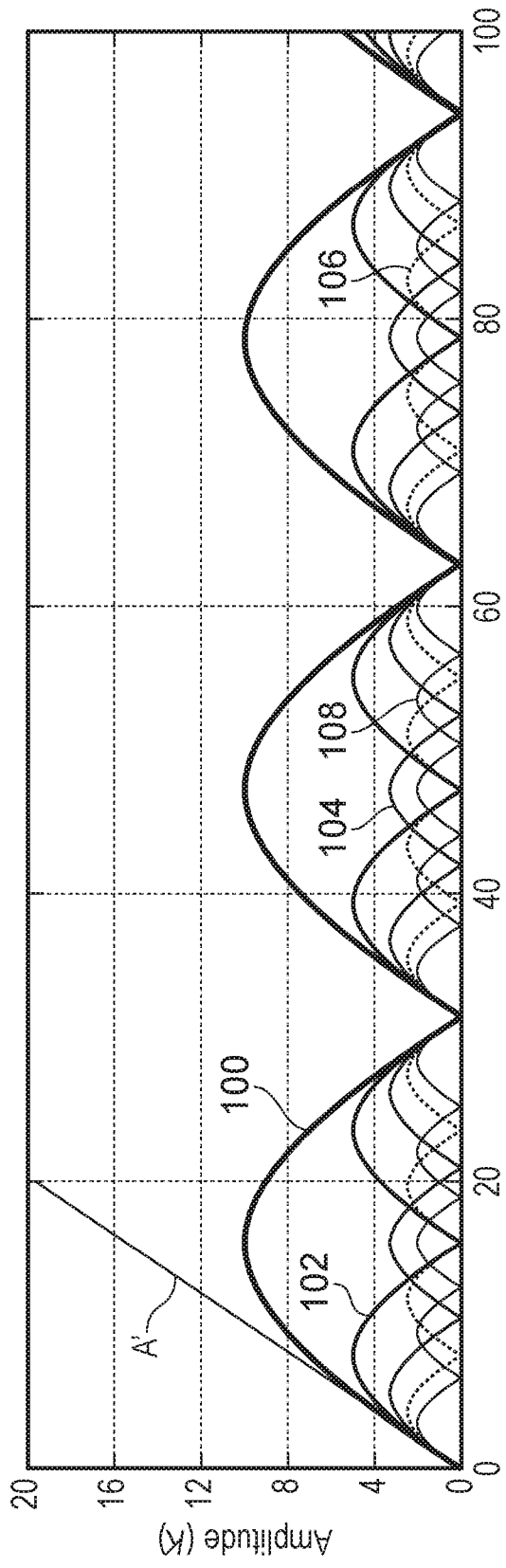

FIG. 3 shows the amplitude of the third harmonic signal 5a as a function of the length along the transmission line (defined by an arbitrary value of x), for different values of $\Delta'_k$. FIG. 3 is exemplary only, since the length scale is defined by arbitrary values of x. FIG. 3 is intended to show the general relationship between $\Delta'_k$, the length of the transmission line, and the energy transfer.

The amplitude with $\Delta'_k=0.2$ is shown by a first curve 100, with the lowest periodicity (three peaks within the arbitrary length defined), and the highest amplitude. For this case, the peak amplitude is at around 10κ. Subsequent curves 102, 104, 106, 108 show the amplitude for $\Delta'_k=0.4, 0.6, 0.8, 1.0$ respectively.

All the curves have major nodes of where there is no amplitude for the third harmonic signal 5a at an arbitrary length of 31, 62 and 93. The curves with $\Delta'_k>0.2$ have additional minor nodes where the third harmonic 5a has no amplitude. These minor nodes occur between the major nodes.

As shown in FIG. 3, the amplitude at a given length increases as $\Delta'_k$ decreases, the overall maximum increases as $\Delta'_k$ decreases, and the maximum amplitude occurs at longer length as decreases. Therefore, extrapolating for the case of $\Delta'_k=0$, the maximum amplitude would be infinite at infinite length, and so the growth of the third harmonic is approximately linear. This can be seen at short lengths for the curves with low $\Delta'_k$, illustrated by the line A'

The above equations use the undepleted pump approximation (i.e. they assume that the input pump signal 5 does not deplete during the energy transfer process). To take pump depletion into account, equation 9a,b can be solved simultaneously using numerical techniques (for example the Runge-Kutta method). The plot in FIG. 3 is illustrative only, and so makes use of the undepleted pump approximation. However, the subsequent plots are solved using numerical techniques.

As the phase difference increases, then the amplitude of the third harmonic signal 5a decreases. Typically, the phase matching from the resonators 17 should be arranged such that $\Delta'_k$ is kept below 0.1. In at least some examples, $\Delta'_k$ should be as close to 0 as possible. For example, $\Delta'_k<<<0.1$.

Figure 4A:
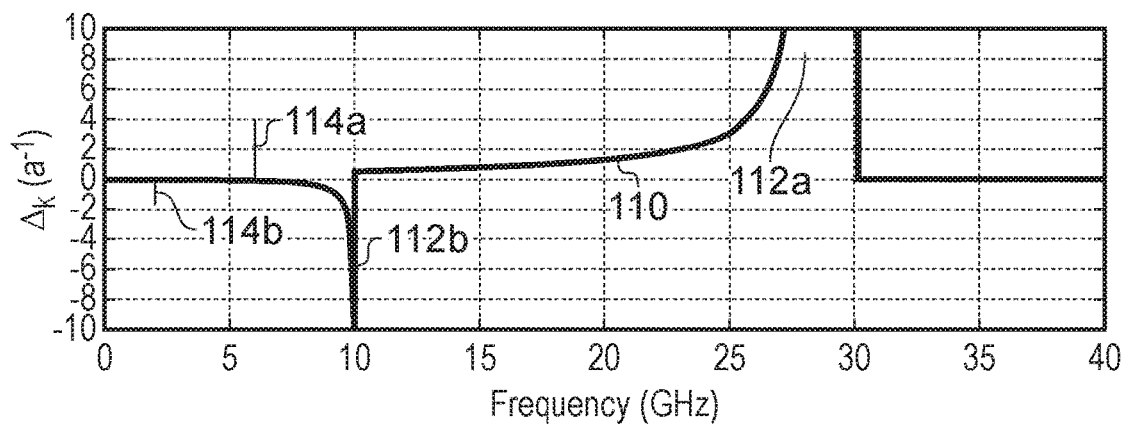
FIG. 4A shows the phase difference between an input signal and the third harmonic of the input signal as a function of the frequency of the input signal, for a first example of a transmission line.

FIG. 4A shows the phase difference 110 for one example of a transmission line 3 modelled as discussed above, as a function of the frequency of the input pump signal 5.

For this example, the Josephson junction 13 of the unit cell 11 is modelled as having junction capacitance of 280 fF and inductance of 100 pH. The resonator 17 is modelled as having fundamental resonant frequency at 6 GHz, and the transmission line 3 is modelled as having 600 unit cells 11.

The phase difference 110 shows a number of resonances 112a,b, 114a,b, which coincide with stopbands in the dispersion relationship. A first resonance 112a is formed at around 30 GHz. This is a result of the natural resonance of the Josephson junctions 13, and is formed where the frequency of the input pump signal 5 approaches the resonance of the Josephson junction 13. A second resonance 112b is formed when the frequency is a third of the natural resonance of the Josephson junctions 13. This is formed because the wavelength of the third harmonic 5a is three times shorter than the input pump wave 5. The first resonance 112a is stronger and wider than the second resonance 112b.

Similarly a third resonance 114a is formed when the frequency of the input pump signal 5 approaches the fundamental resonant frequency of the resonator 17, and a fourth resonance 114b is formed when the frequency of the input pump signal 5 approaches a third of the fundamental resonant frequency of the resonator 17. The fourth resonance 114b is weaker than the third resonance 114a. The third resonance 114a and fourth resonance 114b are both weaker and narrower than the first resonance 112a and second resonance 112b.

Figure 4B:
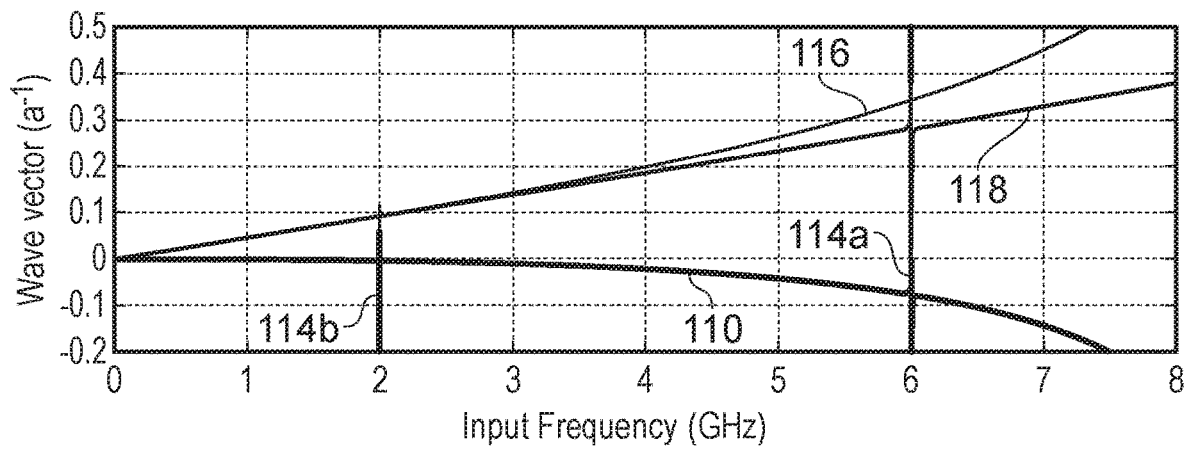
FIG. 4B shows the phase difference from the low frequency end of FIG. 4A, in more detail.

FIG. 4B shows the region from 0 to 8 GHz in more detail. In addition to showing the phase difference 110, FIG. 4B also shows the wavevector (i.e. the dispersion relationship) of the third harmonic 116 and the pump signal 118 (multiplied by 3, as in equation 6a). As can be seen, the third resonance 114a is formed by only the pump signal 5, and the fourth resonance 114b is formed by only the third harmonic 5a.

As shown in FIG. 4B, the magnitude of the phase difference 110 increases with the frequency of the input pump signal 5. However, at the resonances 112a,b, 114a,b, there is a sharp peak in the phase difference. This sharp peak occurs where no signals can propagate down the line. However, on the shoulders of the peaks, the phase difference approaches and passes through zero.

Figure 4C:
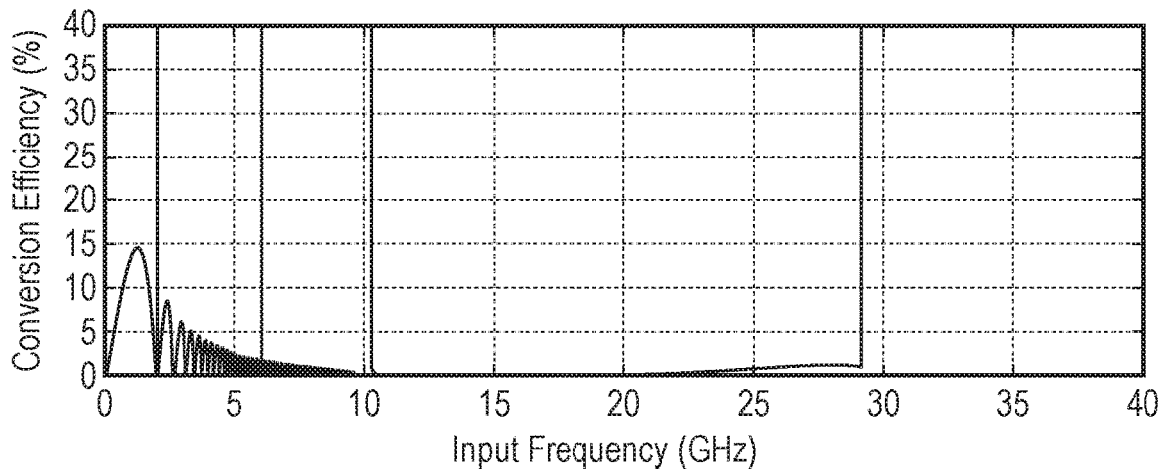
FIG. 4C shows the efficiency of the conversion from the input signal to the third harmonic, for the transmission line having phase difference shown in FIG. 4A.

FIG. 4C shows the conversion efficiency as a function of the frequency of the input pump signal 5. This is the proportion of the input signal 5 which is converted to the third harmonic 5a, and therefore shows the efficiency of the transmission line 3 as an up converter 1.

As can be seen, between the resonances 112a,b, 114a,b, the conversion efficiency shows local maxima. When the input pump signal 5 has frequency near, but slightly offset from the resonances, that are sharp peaks, where the efficiency extends to over 40%. These peaks coincide with the phase difference 110 between the input pump signal 5 and the third harmonic 5a approaching and passing through zero.

When the input pump signal 5 is operated at or near one the peaks in conversion efficiency, the transmission line 3 makes an efficient up converter 1. As discussed above, the phase difference should be kept below at least 0.1. Since the curve for the phase difference is so sharp, very small (e.g. 0.01%) changes in the frequency of the input signal 5 can result in significant changes in the phase differences.

FIG. 5A shows the pump signal amplitude 120 and third harmonic signal amplitude 122 as a function of the current of the input pump signal 5. The transmission line 3 is the same as for FIGS. 4A to 4C, and the currents are normalised to the critical current ($I_0$) of the Josephson junction 13. The upper panel shows an input pump signal 5 at 5.99471 GHz and the lower panel shows an input pump signal 5 at 5.994 GHz FIG. 5B shows the pump signal amplitude 120 and third harmonic signal amplitude 122 as a function of the number of unit cells 11. The electrical characteristics of the transmission line 3 are the same as for FIGS. 4A to 4C, and the current is normalised to the critical current ($I_0$) of the Josephson junction 13. The upper panel shows the case where the input pump signal 5 has current of $0.76I_0$ and frequency of 5.99471 GHz and the lower panel shows the case where the input pump signal 5 has current of $0.5I_0$ and frequency of 5.994 GHz.

FIGS. 5A and 5B show that when the correct frequency for the input signal 5 is chosen, a signal can be generated with high conversion efficiency. FIGS. 5A and 5B further show that by careful tuning of the frequency and current of the input signal, and number of unit cells 11, power transfer to the third harmonic 5a can be maximised, so that the third harmonic 5a is the largest signal at the output 9. FIG. 5B also shows that the power transfer to the third harmonic varies periodically along the length of the transmission line 3, as shown in FIG. 3, and equation (11).

In the examples shown in FIGS. 5A and 5B, the input pump signal is operated at the third resonance 114a in the phase difference. It will be appreciated that the input pump may also be operated near the fourth resonance 114b, in a similar manner.

In the above examples, the resonator 17 is modelled to have a high Q-factor. Comparison of the upper and lower panels of FIGS. 5A and 5B shows that the generation of the third harmonic 5a is highly sensitive to the frequency of the input signal 5. A small change (~1 MHz) in the frequency of the input pump signal 5 can result in an order of magnitude change in the amplitude of the third harmonic signal 5b. Therefore, the up converter 1 is narrowband in operation, in that it can only generate a small range of signal frequencies (or only operate over a narrow range of input frequencies), tied to the frequency of the resonator 17.

The narrowband behaviour results from the fact that the resonances 114a,b in the phase difference 110 caused by the resonators 17 are narrow. This is because of the high Q-factor of the resonators. The operational bandwidth can be increased by reducing the Q-factor of the resonators 17. For the LC resonator circuit shown in FIG. 2, the Q factor can be reduced by increasing the inductance and decreasing the capacitance.

As soon as the Q-factor is reduced, the sensitivity of the up converter to changes in the frequency of the input signal 5 reduces. This results in the resonances 112a,b, 114a,b being less sharp, and broader. Therefore, by reducing the Q-factor, operation over a range of frequencies can be obtained. The Q-factor should be reduced such that the up-converter 1 can achieve high conversion efficiency at broad bandwidth.

The fourth resonance 114b in the phase difference 110 is caused by the resonator 17, which also causes the third resonance 114a. Therefore, if the resonator 17 has a low Q-factor, both resonances will be broadened. With broader resonance, the two resonances 114a,b overlap at intermittent frequencies, and there is an extended region where the phase is close to zero. This region is formed between the fundamental resonant frequency of the resonator 17, and one third of that frequency.

As shown in FIGS. 4A and 4B, the second resonance, at one third of the frequency of the natural resonance of the Josephson junction 13, is very broad in comparison to the third and fourth resonances 114a,b. If the second resonance 112b is close to the third resonance 114a, the second resonance 112b can still affect the phase difference between the third and fourth resonances 114a,b. Therefore, the Josephson junction 13 should be controlled so that the natural resonance of the junction 17 (and the resonance at one third of the natural resonance) is separate from the operational bandwidth. For example, the natural resonance of the Josephson junction 13 should be approximately an order of magnitude or more than the fundamental resonant frequency of the resonator 17.

Figure 6A:
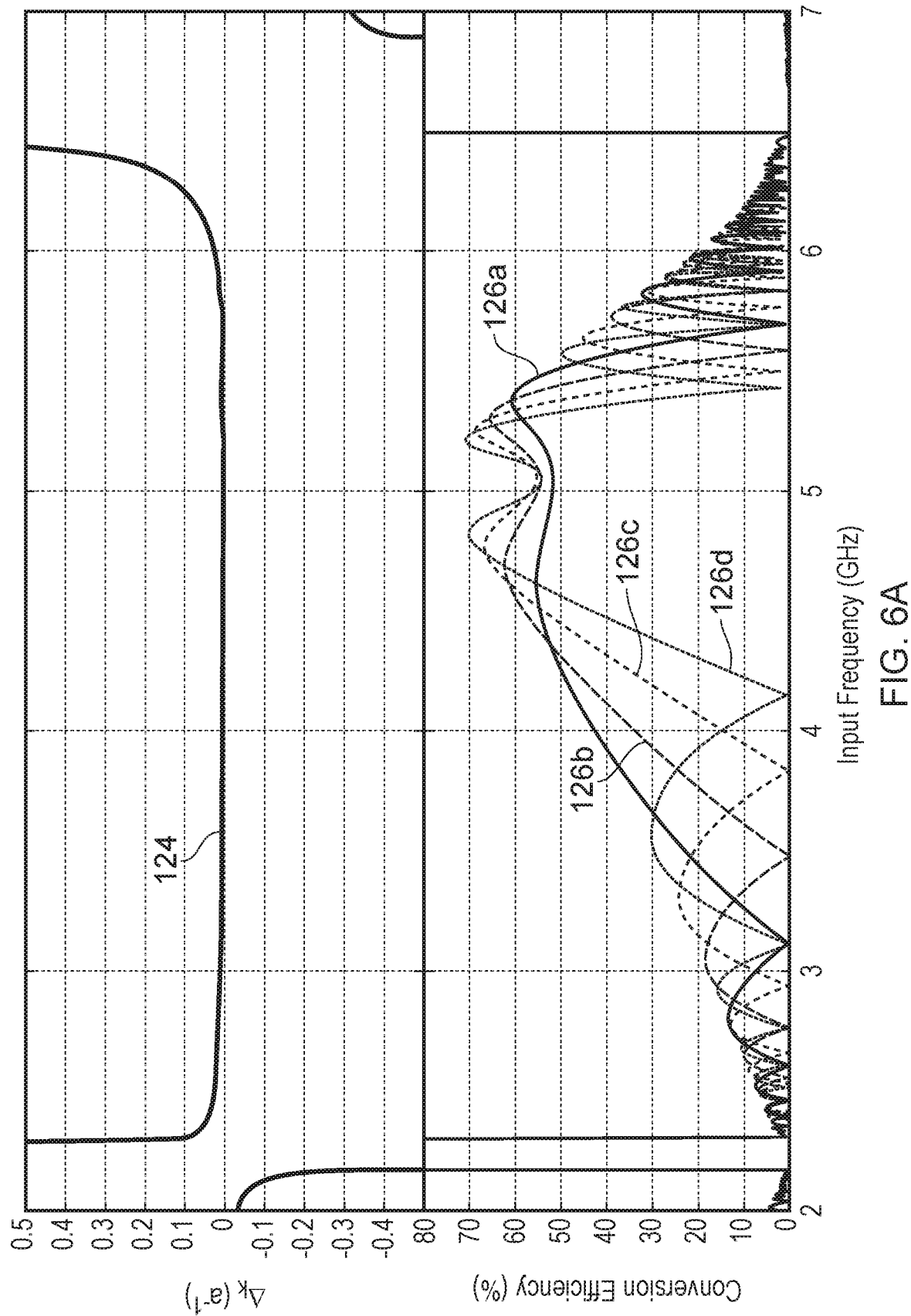
FIG. 6A shows the phase difference between an input signal and the third harmonic of the input signal, and the conversion efficiency from the input signal to the third harmonic, as a function of the frequency of the input signal, for a second example of a transmission line.

FIG. 6A shows the phase difference 124 (upper panel) and conversion efficiency 126 (lower panel) as a function of the frequency of the input pump signal 5, for a transmission line 3 having resonators 17 with fundamental resonant frequency of 6.6 GHz, and a low Q-factor. The natural resonance of the Josephson junction 13 is around 30 GHz. In both cases, the pump signal 5 has a current of $0.645I_0$. In the upper panel, the transmission line 3 includes 600 unit cells. The solid line in the lower panel shows the conversion efficiency 126a with 600 unit cells 11.

The lower panel also shows the conversion efficiency 126b for 800 unit cells, the conversion efficiency 126c for 1000 unit cells, and the conversion efficiency 126d for 1200 unit cells.

Figure 6B:
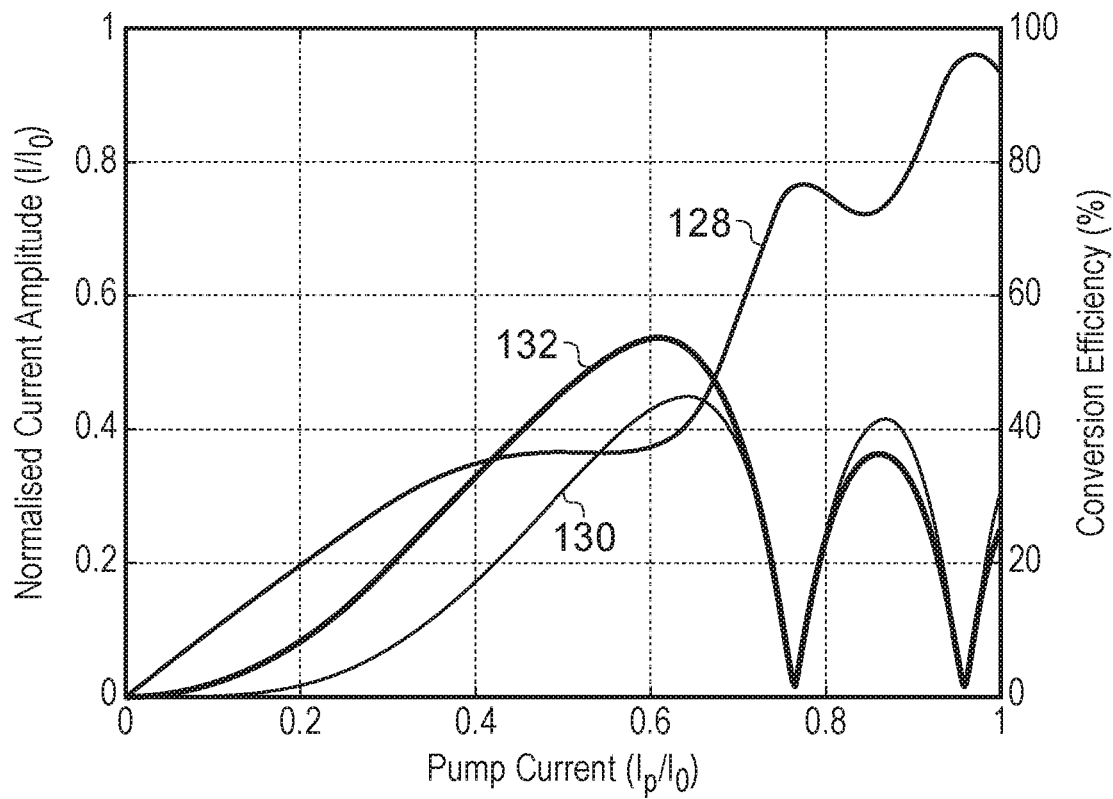
FIG. 6B shows the final amplitude of the input signal and third harmonic, and the conversion efficiency from the input signal to the third harmonic, as a function of the initial amplitude of the input signal, for the transmission line having phase difference shown in FIG. 6A.
Figure 6C:
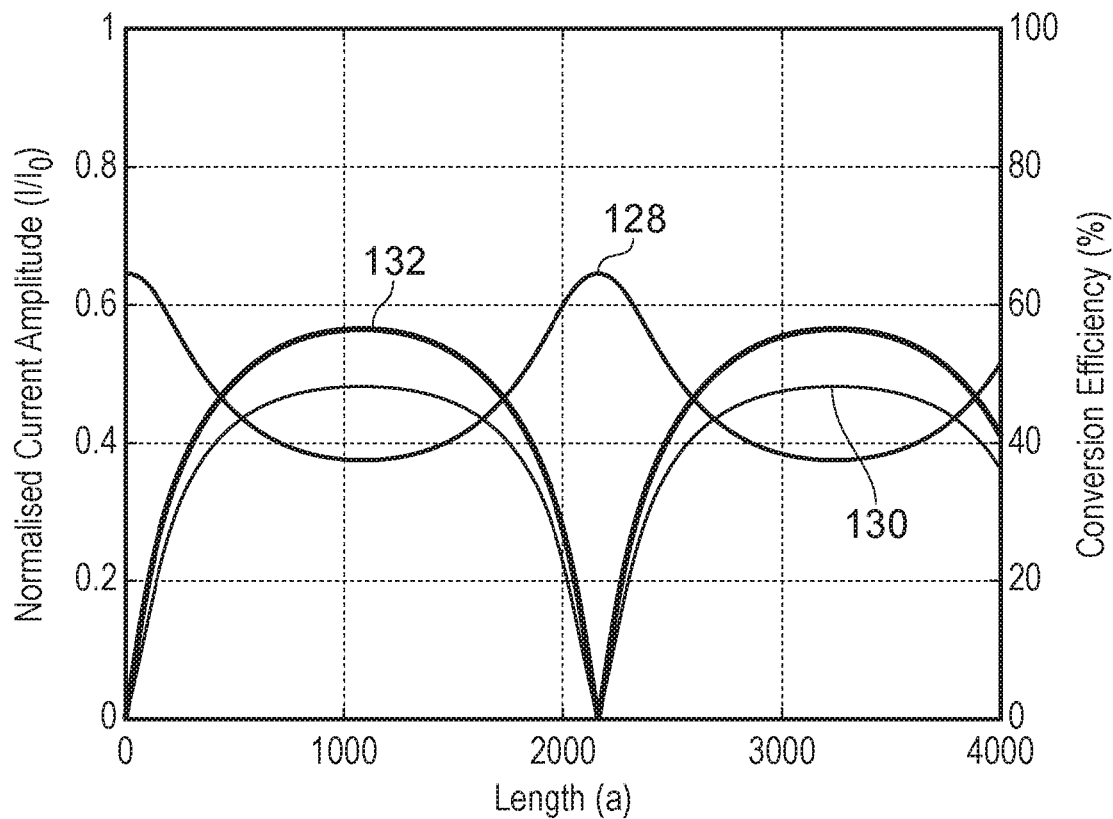
FIG. 6C shows the final amplitude of the input signal and third harmonic, and the conversion efficiency from the input signal to the third harmonic, as a function of the length of the transmission line, for the transmission line having phase difference shown in FIG. 6A.

FIG. 6B shows the input pump signal amplitude 128 and the third harmonic signal amplitude 130, and the conversion efficiency 132 as a function of the current of the input pump signal 5, for the transmission line shown in the upper panel of FIG. 6A, with an input pump signal 5 at 5 GHz. The currents have been normalised to the critical current of the Josephson junction 13. FIG. 6C shows the input pump signal amplitude 128 and the third harmonic signal amplitude 130, and the conversion efficiency 132 as a function of the number of unit cells 11, with an input pump signal 5 at 5 GHz and current $0.645I_0$.

FIG. 6A to 6C show that by using low Q-factor resonators 17, broadband operation of the up converter 1 can be achieved. In the example shown in FIG. 6A, the conversion efficiency is above 40% for input signals between 4 GHz and 5.5 GHz. This corresponds to output signals having frequencies between 12 GHz and 16.5 GHz.

Furthermore, as in the narrowband example, correct choice of current of the input pump signal 5, and the number of unit cells 11 can further tune the conversion efficiency, such that the amplitude of the third harmonic 5a is greater than the input pump signal 5.

The person skilled in the art will appreciate that when the frequency of the third harmonic 5a is above the fundamental resonant frequency of the Josephson junction 13, the third harmonic signal 5a is unable to propagate down the transmission line 3. Therefore, in order to generate higher frequency signals, the natural resonance of the Josephson junction must be increased.

Figure 7A:
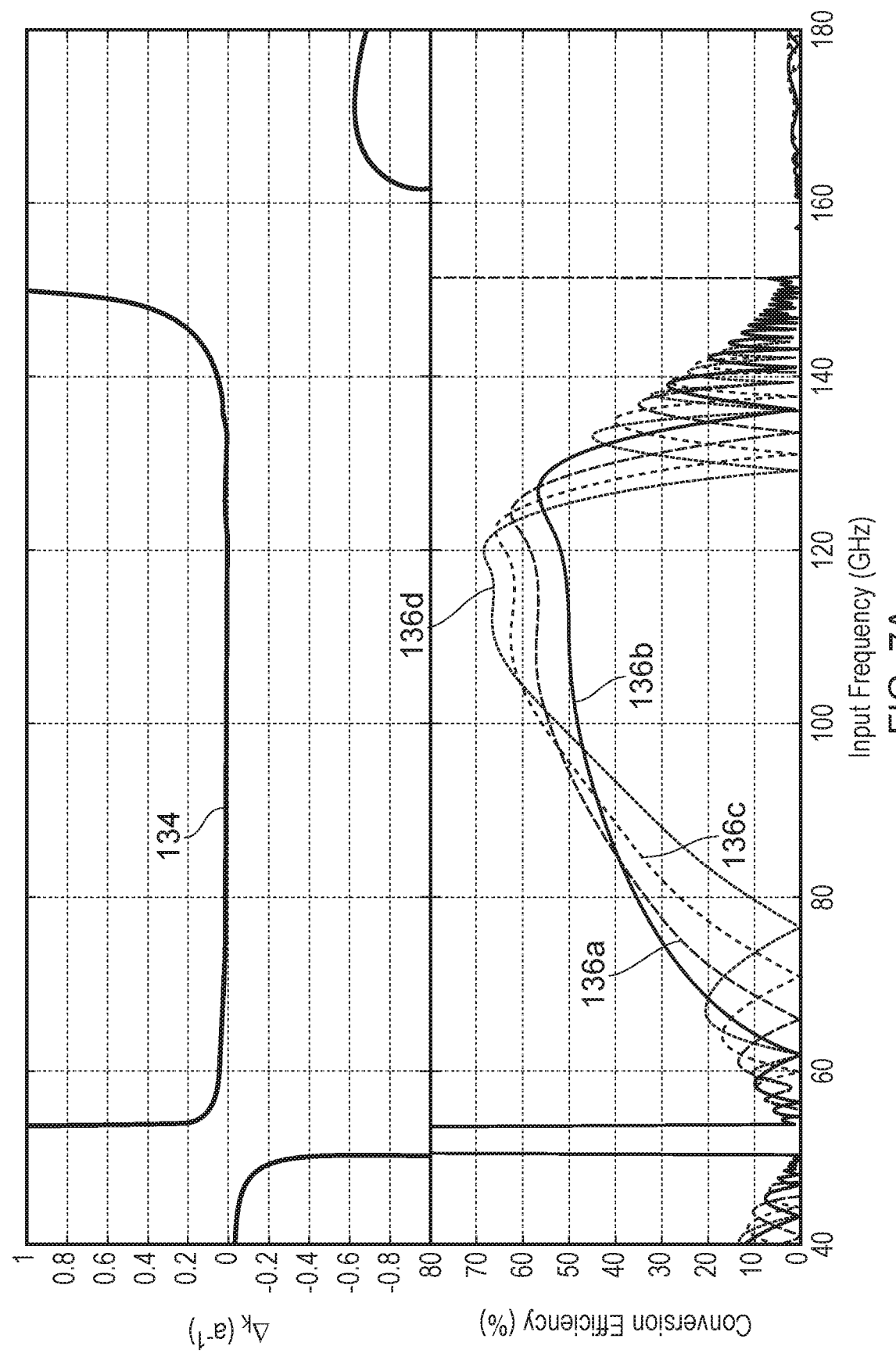
FIG. 7A shows the phase difference between an input signal and the third harmonic of the input signal, and the conversion efficiency from the input signal to the third harmonic, as a function of the frequency of the input signal, for a third example of a transmission line.
Figure 7B:
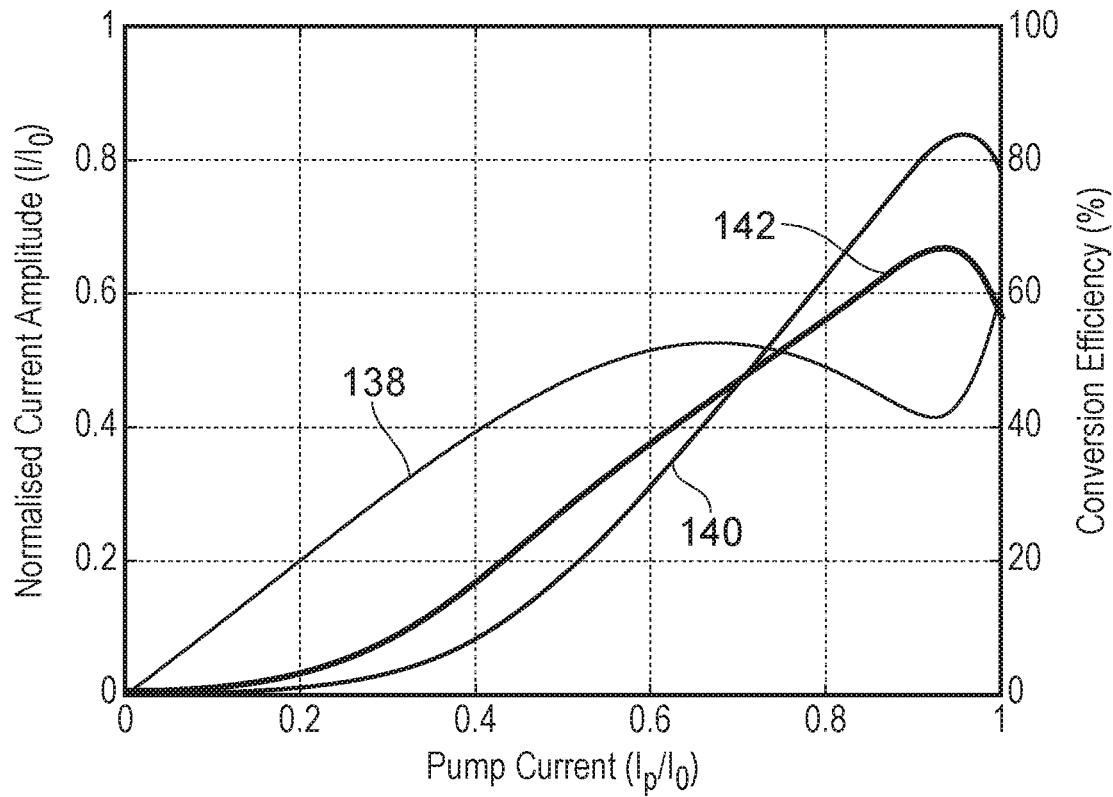
FIG. 7B shows the final amplitude of the input signal and third harmonic, and the conversion efficiency from the input signal to the third harmonic, as a function of the initial amplitude of the input signal, for the transmission line having phase difference shown in FIG. 7A.
Figure 7C:
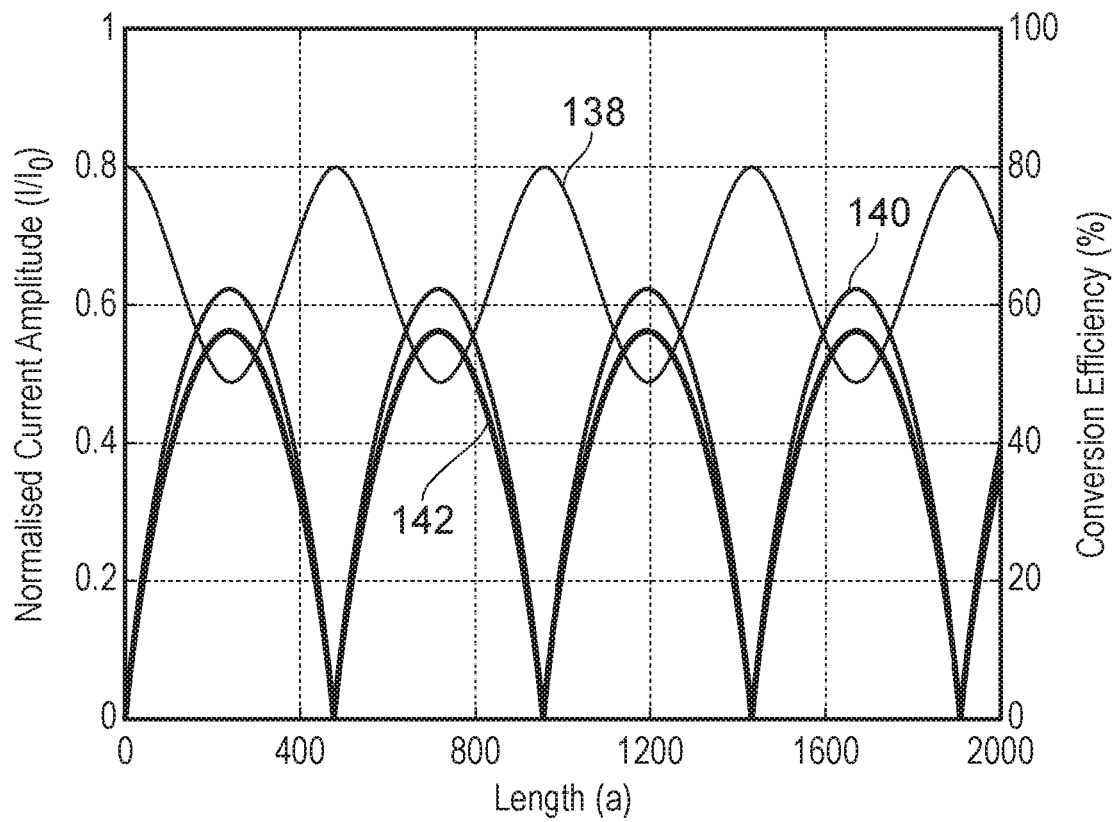
FIG. 7C shows the final amplitude of the input signal and third harmonic, and the conversion efficiency from the input signal to the third harmonic, as a function of the length of the transmission line, for the transmission line having phase difference shown in FIG. 7A.

FIGS. 7A to 7C show the phase difference 134, amplitudes 138, 140 and conversion efficiency 136a-d, 142 for a transmission line 3 formed of Josephson junctions 13 having capacitance of 50 fF and inductance of 1 pH (giving natural resonance at approximately 712 GHz, and a further resonance at approximately 237 GHz). The critical current is $I_0=329$ μA.

In the example shown in FIGS. 7A to 7C, the fundamental resonant frequency of the resonators 17 is approximately 150 GHz, giving a further resonance at approximately 50 GHz.

FIG. 7A shows the phase difference 134 (upper panel) and conversion efficiency 136 (lower panel) as a function of frequency of the input pump signal, for an input pump signal 5 having a current of $0.8I_0$. In the upper panel, the transmission line 3 includes 250 unit cells.

The lower panel shows the conversion efficiency 136a with 250 unit cells 11, the conversion efficiency 136b for 300 unit cells 11, the conversion efficiency 126c for 200 unit cells 11, and the conversion efficiency 136d for 150 unit cells.

FIG. 7B shows the input pump signal amplitude 138 and the third harmonic signal amplitude 140, and the conversion efficiency 142 as a function of the current of the input pump signal 5, for the transmission line 3 shown in the upper panel of FIG. 7A, with an input pump signal 5 at 100 GHz. The currents have been normalised to the critical current of the Josephson junction 13. FIG. 7C shows the input pump signal amplitude 138 and the third harmonic signal amplitude 140, and the conversion efficiency 142 as a function of the number of unit cells 11, with an input pump signal 5 at 100 GHz and current $0.8I_0$.

FIG. 7A to 7C show that by using low Q-factor resonators 17 and Josephson junctions 13 with high natural resonance, broadband operation of the up converter 1 can be achieved in the millimetre wave region. In the example shown in FIG. 7A, the conversion efficiency is above 40% for input signals between 85 GHz and 130 GHz. This corresponds to output signals 5a having frequencies between 255 GHz and 390 GHz.

In the above examples, all the resonators 17 have the same fundamental resonant frequency. In an alternative example, the transmission line 3 may include two sets of resonators 17, a first set having a first fundamental resonant frequency, and a second set having a second fundamental resonant frequency. The sets may be alternated along the transmission line 3, such that each resonator 17 in the first set is provided between a pair of resonators 17 in the second set. Alternatively, the sets may be arranged differently. For example, there may be a pair from the first set followed by a pair from the second set. In yet a further example, resonators 17 from the first and second set may be provided at the same point along the length of the transmission line 3 (for example on opposite sides).

It will be appreciated that each resonator 17 will provide a pair of resonances in the phase difference, as a function of the frequency of the input signal 5. A first resonance will occur at the fundamental resonant frequency of the resonators 17 in the set, with a second occurring at one third of the fundamental resonant frequency of the resonators 17 in the set.

The first set of resonators 17 has a first fundamental resonant frequency $f_{res,1}$, whilst the second set of resonators 17 has a second fundamental resonant frequency $f_{res,2}$. In the example with a single resonator, the operational bandwidth is formed within the region between $f_{res,1}$ and $f_{res,1/3}$. However, the operational bandwidth is limited, because the resonance at $f_{res,1/3}$ is weaker than at $f_{res,1}$, and so the lower boundary of the operational bandwidth is well above $f_{res,1/3}$. This can be shown by, for example, FIGS. 6A and 7A.

If $f_{res,2}$ is above but near $f_{res,1/3}$ (for example, above $f_{res,1/3}$, but below the lower boundary of the operational bandwidth with a single set of resonators 17), then the region in which the phase difference is at or near zero extends further towards $f_{res,1/3}$. This means the lower boundary of the operational bandwidth extends further towards $f_{res,1/3}$, providing further operational bandwidth.

The polarity of the resonance at the natural resonant frequency of a resonator 17 is a flip of the resonance of the third harmonic (for example, see FIG. 4A, in which the natural resonance 114a is positive, and the third harmonic is negative). By setting $f_{res,2} > f_{res,1/3}$, the resonances forming the operation bandwidth have the same orientation, providing a wider operational bandwidth, with stable conversion efficiency.

Furthermore, the Q factor of the resonance at the harmonic of the natural resonance is dependent on the Q-factor of the natural resonance. However, by using a separate resonator 17 to form the lower end of the bandwidth, the Q-factors of the resonances forming the bandwidth can be controlled separately, providing a wider operational bandwidth.

Figure 8:
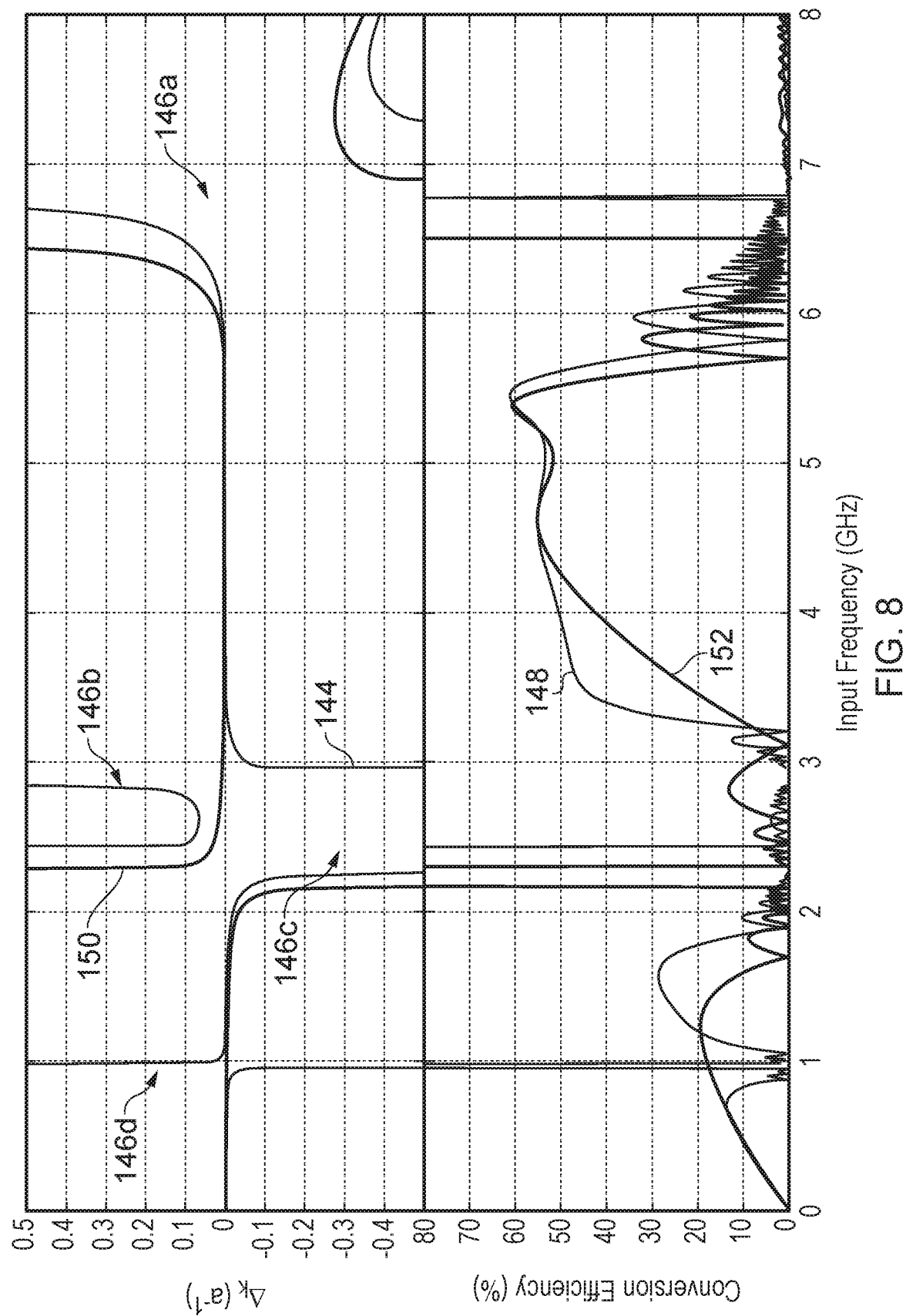
FIG. 8 shows the phase difference between an input signal and the third harmonic of the input signal, and the conversion efficiency from the input signal to the third harmonic, as a function of the frequency of the input signal, for a fourth example of a transmission line.

The upper panel of FIG. 8 shows the phase difference 144 for a transmission line 3 having two sets of resonators 17, the first having fundamental resonant frequency at approximately 6.8 GHz, and the second having fundamental resonant frequency at 2.4 GHz. The transmission line is assumed to have 600 unit cells (each having a single Josephson junction 13, with a resonator 17 from the first set and a resonator 17 from the second set after the junction 13). The natural resonance of the Josephson junctions 13 is assumed to at least 30 GHz.

The phase difference 144 shows four separate resonances 146a-d. The first resonance 146a, at approximately 6.8 GHz, is a result of the fundamental resonant frequency of the first set of resonators 17. The second resonance 146b, at approximately 2.4 GHz, is result of the fundamental resonant frequency of the second set of resonators 17. The third and fourth resonances 146c,d are formed at approximately 2.2 GHz and 0.8 GHz (one third of the fundamental resonant frequencies of the two different sets of resonators 17).

The lower panel of FIG. 8 shows the conversion efficiency 148 for a transmission line 3 having two sets of resonators 17 that provide the phase difference 144 shown in the upper panel. In this example, the conversion efficiency is above 40% for input signals between 3.4 GHz and 5.6 GHz. This corresponds to output signals 5a having frequencies between 10.2 GHz and 16.8 GHz.

For comparison, FIG. 8 also shows the phase difference 150 and conversion efficiency 152 for an identical transmission line 3, but with all 600 resonators 17 having fundamental resonant frequency at 6.8 GHz. As can be seen from FIG. 8, the operational bandwidth with two different sets of resonators 17 is wider than for a single set, and the conversion efficiency is also more stable across this region.

In the above examples, the Josephson junction 13 is formed of electrodes of any suitable superconducting materials, separated by a region of any suitable non-superconducting material. For example, the superconducting material may be niobium, niobium nitride, niobium titanium nitride, or any other low or high temperature superconductor. The superconducting material may also be aluminium, or another metal, in a superconducting state. The insulating layer may be an aluminium oxide or nitride, or any other insulating material.

The Josephson junctions 13 are connected to each other using any suitable conducting or superconducting line. For example, the Josephson junction 13 may be connected in series by a superconducting transmission line.

Figure 9A:
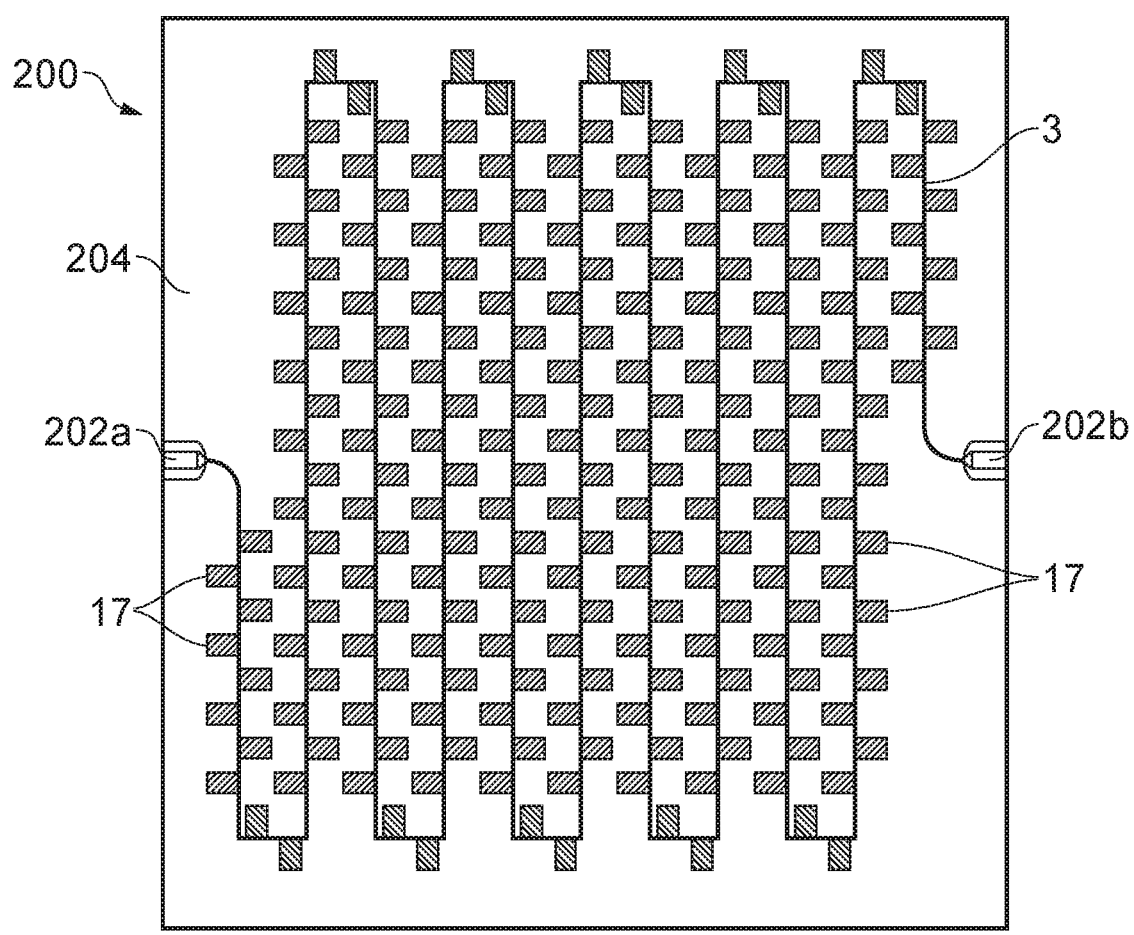
FIG. 9A illustrates an example structure for implementing the up converter of FIG. 1, with the unit cell of FIG. 2.
Figure 9B:
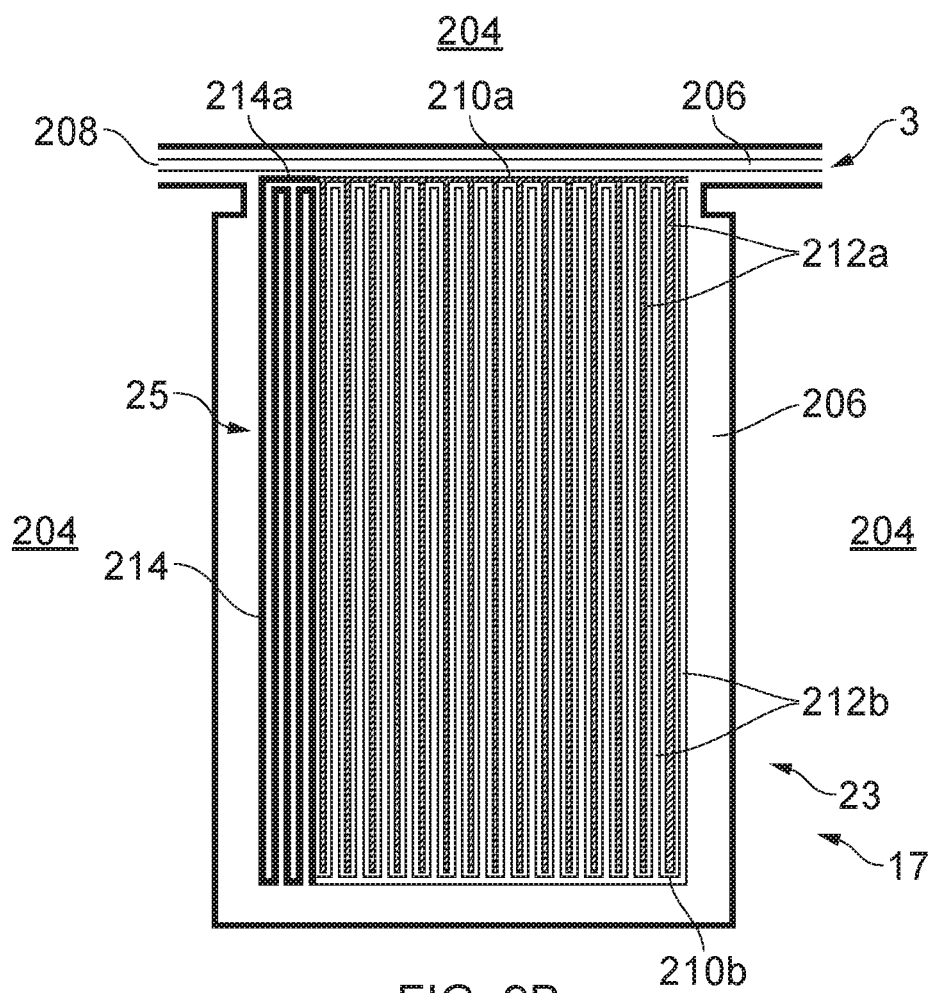
FIG. 9B illustrates a resonator in the structure of FIG. 9A.
Figure 9C:
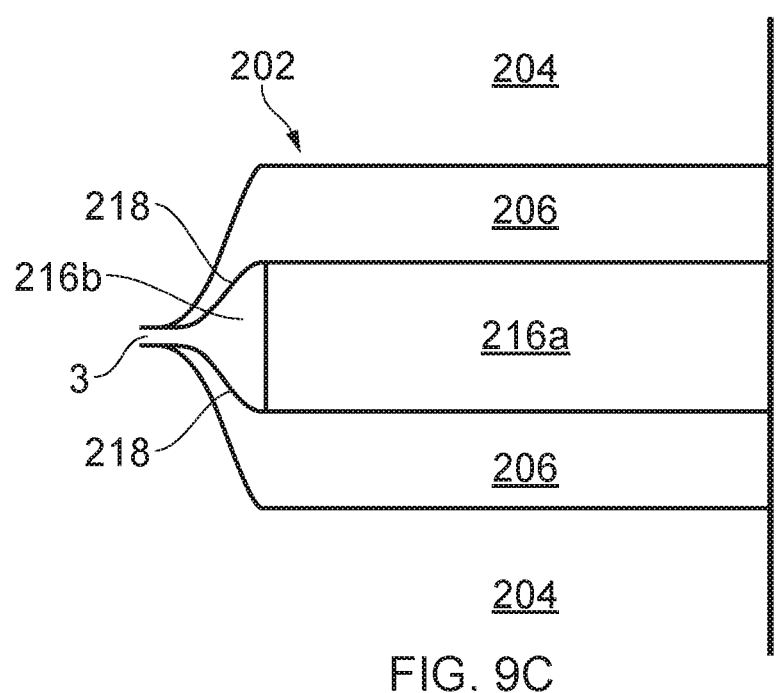
FIG. 9C illustrates a bonding contact in the structure of FIG. 9A.

The person skilled in the art will appreciate that there are many different structures that can be used to implement the converter 1 discussed above. FIGS. 9A to 9C illustrates just one example of a physical structure. The structure 200 is formed on a chip or die and includes the transmission line 3 extending between a pair of bonding contacts 202a,b. The bonding contacts 202a,b provide a means for connecting the transmission line 3 to a wider system (not shown) using wire bonding or other suitable techniques. Resonators 17 are formed on either side of the transmission line 3.

The chip 200 is formed of a conducting layer 204 provided on a substrate 206. For example, the substrate 206 may be silicon and the conducting layer 204 aluminium.

The transmission line 3 is formed by electrically isolating a thin strip 208 of the conducting layer 204 in the plane of the substrate 206. This is accomplished by removing (for example by etching) the conducting layer 204 down to the substrate 206 on either side of the strip 208, to isolate the strip 208. The transmission line 3 follows a path of that minimises the overall space taken up on the chip 200, whilst providing the desired length.

FIGS. 9A and 9B do not show the Josephson junctions 13, for clarity. It will be appreciated that the Josephson junctions may be provided in any suitable manner. For example, they may be provided in the structure of the conducting layer 204, or formed in the conducting layer using known processing techniques. The Josephson junctions 13 are embedded in series along the strip 208.

FIG. 9B shows a section of the transmission line 3 and a single resonator 17 in more detail. The capacitor 23 and inductor 25 in the resonator 17 are also formed by isolating regions of the conducting layer 204.

Each plate of the capacitor 23 is formed by a track 210a,b, with a plurality of fingers 212a,b extending perpendicular to the track 210a,b. The tracks 210a,b extend parallel to each other, with the fingers 212a,b extending towards the other track 210a,b without joining it, so that the fingers 212a,b are interleaved.

The capacitance of the capacitor 23 can be tuned by varying the width and spacing of the tracks 210a,b and the width, spacing and number of the fingers 212a,b.

The inductor 25 is formed by a conductance path 214 joining the tracks 210a,b of the capacitor plates. The conductance path 214 joins the tracks 210a,b at a first end of each track 210a,b. The inductance of the inductor 25 can be tuned by varying the width and length of the path 214. In the example shown in FIG. 9B, the conductance path 214 doubles back on itself a number of times, parallel to the fingers 212a,b of the capacitor, to create the correct length path 214 without using too much space on the chip 200. A coupling region 214a of the conductance path 214 extends parallel to the tracks of the capacitor 37.

The resonator 17 is coupled to the transmission line 3 by providing the resonator 17 adjacent the transmission line 3. The resonator 17 is provided so that the tracks 210a,b of the capacitor plates extend parallel to the transmission line 3 in the region where the resonator 17 is coupled to the transmission line 3. The resonator 17 is positioned so that the coupling region 214a of the inductor 25 and the track 210a of a first plate of the capacitor 23 run adjacent the transmission line 3.

The resonator 17 is spaced from the transmission line 3. However, the conducting layer 204 has been removed between the transmission line 3 and the resonator 17, so that there is direct coupling between the resonator and transmission line 3. This maximises the coupling capacitance for the resonators, shown by capacitor 27 between the transmission line 3 and resonators 17 in FIG. 2, whilst keeping it electrically isolated.

FIG. 9C illustrates the bonding contacts 202a,b in further detail. As shown in FIG. 9C, the bonding contacts 202a,b are formed by a conducting region 216 surrounded by a region of the exposed substrate 206, such that the conducting region 216 is electrically isolated.

The conducting region 216 is formed by a first rectangular section 216a and a second tapered section 216b. The first section 216a provides an area for connection out to the wider system.

The tapered section couples the transmission line 3 to the second section 216b. At a first end, the tapered section 216b is the same width as the rectangular section 216a. Over the length of the tapered section 216b, the width narrows to match the transmission line 3.

The shape of the tapered section 216b may provide for impedance matching between the transmission line 3 and the rest of the system the bonding pads 202a,b connect out to. Typically, the transmission line may have an impedance of 20 Ohms or less. However, the wider system may have an impedance of 50 Ohms or more. Therefore, impedance mismatching can be significant.

If the width narrows simply as a linear function of the length of the tapered section 216b, the bonding pads 202a,b may act to reflect signals, such that the transmission line acts as a resonant cavity. However, as discussed above, this can limit conversion efficiency. Therefore, the edges 216 of the tapered section 216b follow a curved profile.

Around the first section 216a, and the transmission line 3 the exposed substrate 206 also follows a rectangular profile. Around the tapered section 216b, the exposed substrate again follows a curved profile. However, the profile is different to the conducting region 216, since the exposed substrate 206 around the transmission line 3 is narrower than the exposed substrate 206 around the first section 216b of the conducting region 216 of the bonding contact 202.

As with the conducting region 216, the profile of the exposed substrate 206 is a function of the distance between the transmission line 3 and the first section 216a, the material and dimensions of the substrate 206, conducting layer 204 and superconducting materials, and the required impedance at either end of the tapered section.

In the examples discussed above, the resonator 17 is spaced from the transmission line 208 by a gap. In other examples, a region of conducting material 206 may be provided between the transmission line 208 and the resonator 17. This region may be electrically isolated from one or both of the resonator 17 and the transmission line 208. Alternatively, the resonator 17 may be electrically connected to the transmission line 208.

In the example shown in FIG. 2, the resonator 17 is coupled to earth. However, it will be appreciated that this is optional. As shown in the example shown in FIG. 9B, the resonator 17 may not be directly connected to earth (not including any leakage to the earth plane, shown by the conductive layer 204, or weak fringing effects). Connecting to earth may be achieved be connecting the second track 210b to the body of the conducting layer 204.

The contact 202a,b discussed above is also given by way of example only. Any suitable contact that achieves sufficient impedance matching may also be used.

It will be appreciated that the structure 200 discussed above can be used to implement an up-converter 1 in a single layer process, since all features are formed in the same plane. The use of a single layer process means that the structure is simple to form, compared to multi-layer processes. The structure given above and shown in FIGS. 9A to 9C is given by way of example only, and any suitable structure can be used.

It will be appreciated that the fundamental resonant frequencies and operational bandwidths discussed above are given by way of example only. The electrical characteristics of the Josephson junctions 13 and resonators 17 may be altered to give the desired operation bandwidth.

The person skilled in the art will appreciate that for very high frequency operation (e.g. millimetre wave signals, near-terahertz signals or higher frequencies), it may not be possible to provide Josephson junctions 13 with a sufficiently high natural fundamental resonant frequency. In this case, the Josephson junction 13 may be replaced in the unit cell by a high current density superconductor-insulator-superconductor (SIS) junction. For example, the junction may be Niobium nitride/Aluminium nitride/Niobium nitride.

The use of an SIS junction provides for a high natural junction resonance, meaning higher operational frequencies can be achieved. Furthermore, by using an SIS junction, the Q-factor of the Josephson junction 13 is increased, without affecting the operational bandwidth, providing a more stable dispersion relationship, and without affecting the Q-factor of the resonators 17.

Use of an SIS junction also improves power handling capabilities, since the input pump signal 5 cannot have higher power than the critical current of the junction 13.

FIGS. 10A to 10C show the case for a transmission line 3 formed of SIS junctions having capacitance of 50 fF and inductance of 0.22 pH (giving natural resonance at approximately 1500 GHz, and a further resonance at approximately 500 GHz). The critical current is $I_0=1.5$ mA.

In the example shown in FIGS. 10A to 10C, the fundamental resonant frequency of the resonators is approximately 450 GHz, giving a further resonance at approximately 150 GHz.

FIG. 10A shows the phase difference 154 (upper panel) and conversion efficiency 156 (lower panel) as a function of the frequency of the input pump signal, for an input pump signal 5 having a current of $0.8I_0$. In the upper panel, the transmission line 3 includes 100 unit cells.

The lower panel shows the conversion efficiency 156a with 100 unit cells 11, the conversion efficiency 156b for 120 unit cells 11, the conversion efficiency 156c for 140 unit cells 11, and the conversion efficiency 156d for 180 unit cells.

FIG. 10B shows the input pump signal amplitude 158 and the third harmonic signal amplitude 160, and the conversion efficiency 162 as a function of the current of the input pump signal 5, for the transmission line shown in the upper panel of FIG. 10A, with an input pump signal 5 at 300 GHz. The currents have been normalised to the critical current of the SIS junction. FIG. 10C shows the input pump signal amplitude 138 and the third harmonic signal amplitude 140, and the conversion efficiency 142 as a function of the number of unit cells 11, with an input pump signal 5 at 300 GHz and current $0.8I_0$.

FIG. 10A to 10C show that by using low Q-factor resonators 17 and SIS junctions with high natural resonance, broadband operation of the up converter 1 can be achieved in the terahertz wave region. In the example shown in FIG. 10A, the conversion efficiency is above 40% for input signals between 250 GHz and 350 GHz. This corresponds to output signals 5a having frequencies between 750 GHz and 1.05 THz.

As with the examples using Josephson junctions 13, the electrical characteristics and operational bandwidth discussed in relation to FIGS. 10A to 10C are given by way of example only. Any suitable operational bandwidth can be achieved by correct choice of the electrical characteristics. Furthermore, SIS junctions may be used instead of Josephson junctions 13 at lower frequency operation.

It will be appreciated that in some examples, a wideband source may be used as an input to the up converter 1. Furthermore, in some examples two or more up-converters 1 may be provided in series, to provide a chain of converters. For example, the output of a first converter may be provided as the input of a second converter 1.

In one example, the second converter 1 may be arranged to further up-convert the harmonic signal 5a generated at the output 9 of the first converter 1. In such scenarios, the characteristics of the first converter 1 may be set to provide maximum conversion rate, at the expense of bandwidth, to ensure that the input to the second converter is as high as possible. This provides maximum overall conversion efficiency for the chain. The chain may also include filters after each converter 1, in order to filter out undesired signals.

Furthermore, in some cases, the output power from the low frequency wideband source may be split, and provided to multiple chains to provide output signals. This is because each chain only uses a small portion of the output power of the wideband source.

The person skilled in the art will appreciate that fifth 5b and higher harmonics will be generated along the transmission line 3. In the examples discussed above, the fifth and higher harmonics will have frequencies above the natural fundamental resonant frequency of the Josephson junction 13 or SIS junction. Therefore, these signals will not propagate down the transmission line 3.

However, in other examples, if the resonance of the junction is sufficiently high, the fifth and higher harmonics can also be considered, and may need to be filtered out, if not needed. It will be appreciated that just as the electronic and physical characteristics of the transmission line 3 and resonators 17 can be tuned to maximise conversion to the third harmonic 5a, the fifth harmonic 5b, or any other desired harmonic, may also be used.

In some examples where higher harmonics are generated, these higher harmonics may be used at the output, and the third harmonic may be filtered out.

In the above equations, only third order terms are included, because the fifth and higher order harmonics are not needed. However, where the fifth and higher order harmonics signals are wanted, the fifth and higher order terms also need to be considered in the equations. Higher order harmonics must be considered for both the input pump wave 5, and the resonators 17.

Where fifth and higher order harmonics are considered, additional resonances will be created when the input pump signal 5 approaches $\frac{1}{5}f_{res}$, $\frac{1}{7}f_{res}$ and the like. The third harmonic of the resonator 17 may still limit the operating bandwidth, even when the third harmonic 5a is not being used. This is because, the third harmonic of the resonator 17 will still provide a stop band, where signals cannot propagate down the transmission line 3.

In some examples, the stop band at the third harmonic may provide a boundary to the operating bandwidth. In other examples, the bandwidth may extend further. However, the operating bandwidth will include a region within it where no signals are generated, for a given input signal frequency, at the third harmonic resonance.

The fifth harmonic of the fundamental resonance of the Josephson junction 13 should also be considered. For the case where the third harmonic signal 5a is taken at the output, the fifth harmonic resonance of the Josephson Junctions 13 is often below the desired operational bandwidth or too low to be considered. However, in general, where the $n^{th}$ harmonic is taken as the output, the $n^{th}$ resonance of the Josephson junction 13 should be above the operational bandwidth.

The unit cell 11 discussed above is given by way of example only. It will be appreciated that the unit cell 11 may have any suitable structure that provides a non-linear transmission line 3. For example, there may be more than one Josephson junction 13 and/or SIS junction connected in series in each unit cell 11. Similarly, each unit cell 11 may contain more than one resonator 17, and the resonators 17 in a unit cell 11 may have the same fundamental resonant frequencies, or different fundamental resonant frequencies.

In further examples, the Josephson junction 13 and/or SIS junction may be replaced with any layered structure that allows quantum tunnelling across a central layer, and which has sufficient non-linearity. For example a normal metal junction or superconductor-insulator-normal metal (SIN) structure may be used. Alternatively, a superconducting quantum interference devices (SQUIDs) could be used. A SQUID is a pair of Josephson Junctions connected in parallel.

In the examples discussed above each unit cell 11 in the transmission line 3 is identical. It will be appreciated that this is by way of example only. In some examples, the unit cells 11 may be different. It may be that all of the unit cells 11 are different from each other. Alternatively, there may be a number of different unit cells 11 which are repeated.

The resonators 17 alter the dispersion relationship of the transmission line 3, so that the phase difference between the input pump signal 5 and the third harmonic 5a is kept at or near zero. The intrinsic dispersion relationship is modified by the stopbands, and the dispersion relationship without the effect of the stopbands can be seen by interpolation of the dispersion relationship at frequencies between the stopbands, so that it extends across the stopbands.

In some examples, the phase matching may be achieved without a stopband. Instead, the dispersion relationship may simply diverge away from the intrinsic (approximately linear) relationship at the first frequency and the second frequency. The operational frequency of the transmission line 3 will fall within the range of the resonances formed by the resonators 17. However, since there is no stopband, waves still may be able to propagate at these frequencies.

It will be appreciated that any other suitable phase matching techniques may be used, in place of the resonators 13. Any suitable dispersion control element may be used to alter the dispersion relationship away from the intrinsic dispersion relationship, in order to ensure that the total phase mismatch is close to zero. The resonators 13 is just one example of this. In some examples, alternative phase matching may be required, (for example $\Delta k \neq 0$), and the dispersion control elements may be arranged to achieve this.

In addition, the resonator 13 described above is by way of example only. Any suitable resonator could be used. For example, the resonators 17 may be a quarter wavelength or half wavelength resonator formed by, for example, a spiral sections of co-planar waveguide or microstrip, or other paths of co-planar waveguide and microstrip.

In the above examples, the transmission line 3 is formed by an array of superconducting tunnelling devices (e.g. Josephson junctions, SIS junctions, normal metal junctions, SIN junctions or SQUIDS).

In the above example using two sets of resonators, 17 $f_{res,2} > f_{res,1/3}$. In other examples, $f_{res,2} < f_{res,1/3}$. In these examples, the operational bandwidth may still be broader, with a more stable conversion efficiency, but the lower boundary of the bandwidth is set by $f_{res,1/3}$.

In other examples, the transmission line 3 may be implemented using a superconducting wire (for example a microstrip, or co-planar waveguide), or a superconducting wire with embedded superconducting tunnelling structures.

In the case of a superconducting wire or embedded superconducting wire, the dispersion control element may be formed by resonators 17 or periodic loading of the wire, or other periodic alterations to the wire. The periodic loading creates regions in the wire of different impedance. The spacing of the regions determines the frequency of the resonance in the phase difference.

In the example of a co-planar waveguide with periodic loading, the periodic loading is formed by regions where the width of the central conductor is increased. The spacing of the wider regions is approximately $0.5\lambda_{per}$, where $f_{per} = c/\lambda_{per}$ determines the fundamental frequency of the periodic loading. As with the resonators 17, a first resonance will be formed at the fundamental frequency. If every third periodic loading region has an altereted structure (e.g. shorter length), a second resonance at $\frac{1}{3}f_{per}$ is also formed, along with a resonance at $\frac{2}{3}f_{per}$, although the resonance at $\frac{2}{3}f_{per}$ is not necessary for the operation of the up-converter 1.

If considering higher order harmonics, then, in some examples, the second resonance can be created by altering the structure of, for example, every fifth periodic loading region, rather than every third. In general, resonances can be created at $1/n, 2/n, 3/n \ldots$ and $n-1/n\ f_{per}$ by modifying every $n^{th}$ structure.

It will be appreciated that the wire may be formed of any suitable superconducting material. For example, the wire may be titanium nitride or niobium titanium nitride, vanadium nitride, or any other high normal state resistivity superconductor.

The periodic loading may be achieved by any suitable change in the wire that creates stopbands in the dispersion relationship. For example, the material or thickness of the wire 47 may be changed, rather than the width. In yet further examples, any periodic change to the wire 47 may be used to create stopbands.

It will be appreciated that, when formed using a coplanar waveguide, the up converter 1 can be formed in a single layer process, since it simply requires use of a co-planar wire.

It will be appreciated that the non-linear media discussed above are given by way of example only, and any suitable low loss, non-linear medium could be used. In some examples the non-linear medium has non-zero dispersion. In other examples, the medium may be dispersionless in the absence of dispersion control elements. In this case, the dispersion control elements still introduce stopbands, and may further introduce some level of dispersion, around the stopbands.

In the examples discussed above, a single signal 5 is provided at the input 7 of the transmission line 3. No other signals are provided. Therefore, there will be no mixing processes between different signals in the line. There may be some mixing between the input signal and its harmonics. This is negligible, where the mixed components are not phase matched and only a single output is required.

The superconducting materials remain superconducting (and hence low loss) when frequencies of signals propagating through the material are below a breakdown frequency. Typical breakdown frequencies for superconducting materials are hundreds of GHz or higher. This breakdown frequency controls the maximum frequency of input signal 5 that may be used. For example, for Niobium is approximately 680 GHz, and the breakdown frequency for Niobium nitride or Niobium titanium nitride is approximately 1.4 to 1.5 THz.

In the above examples, a single signal (a harmonic 5*a,b* of the input signal 5) is taken, at the output 9, and the conversion efficiency to that signal is maximised. In other examples, it may be the case that the conversion efficiency is tuned to leave controlled amounts of power in two or more different signals, such as the input signal 5 and one or more harmonic, 5*a,b*, or two or more of the harmonics 5*a,b*. It will be apparent from the above discussion that correct choice of parameters for the up-converter 1 can achieve this.

In some examples where multiple harmonics are generated, the resonators 17 may be arranged to phase match the harmonic components, to encourage intermixing, in order to generate further new signals at additional frequencies, through three of four wave mixing processes. These signals are still generated by a single pump input 5. As with the conversion from the input signal 5 to a harmonic, the efficiency of intermixing is improved by phase matching components which are intermixed.

Furthermore, in examples having two or more harmonics taken at the output 9, and with two or more up-converters 1 arranged in series, the first up converter 1 may be arranged to equalise the power in two different harmonic signals, and the second up-converter 1 may be arranged to encourage intermixing between the harmonic signals, to generate a new frequency component. This is achieved by phase matching the harmonic signals, as discussed above.

In the examples discussed above, a single input signal 5 is provided, having a single frequency (or small range of frequencies). However, it will be appreciated that in some examples, there may be more than one input signal 5 or frequency may be received. Each input signal frequency will be up-converted, to provide a plurality of frequencies at the output. There may be some mixing between the different inputs, but these are not used in the output.

It will be appreciated that the up converter 1 discussed above may be operated at cryogenic temperatures, or higher, and can even be operated at room temperature, when using room temperature superconducting materials.

In the example discussed above, the harmonics discussed are odd (and/or even) integer harmonics such as the third, or fifth harmonics. However, it will also be appreciated that sub-harmonics, such as the $\frac{1}{3}^{rd}$, $\frac{1}{5}^{th}$ and the like may be generated, in which case, the system is a down-converter.

The invention claimed is:

1. A frequency converter for generating an output signal from an input signal, the output signal having different frequency than the input signal, the frequency converter including:
   an input for receiving an input signal;
   a transmission line formed of a non-linear medium, the medium arranged such that when the input signal propagates along the line, one or more harmonics of the input signal are generated;
   a plurality of dispersion control elements, the dispersion control elements arranged to control the dispersion relationship of the medium, to phase match the input signal and the one or more harmonics, such that energy is transferred from the input signal to the one or more harmonics; and
   an output for providing the one or more harmonics as an output signal,
   wherein the output signal comprises one or more integer multiple harmonics of the input signal, such that the frequency converter is an up converter.

2. The frequency converter of claim 1, wherein the input signal and the one or more harmonics are phase matched such that the phase difference between the signals is kept at zero or substantially zero.

3. The frequency converter of claim 2, wherein the input signal and the one or more harmonics are phase matched when the frequency of the input signal is substantially at a first frequency or a second frequency.

4. The frequency converter of claim 2, wherein the dispersion control elements have a low Q-factor.

5. The frequency converter of claim 4, wherein the signal and the one or more harmonics are phase matched when the frequency of the input signal is between the first frequency and the second frequency.

6. The frequency converter of claim 3, wherein the first frequency is a fundamental resonance of the dispersion control elements, and the second frequency is a result of a harmonic of the fundamental resonance.

7. The frequency converter of claim 6, wherein the second frequency is one third of the first frequency.

8. The frequency converter of claim 3, wherein the plurality of dispersion control elements includes a first set of dispersion control elements having a first fundamental frequency, and a second set of dispersion control elements having a second fundamental frequency, and the first frequency is the fundamental resonance of the first set of dispersion control elements, and the second frequency is the fundamental resonance of the second set of dispersion control elements.

9. The frequency converter of claim 1, wherein the plurality of dispersion control elements comprises one or more sets of resonators, each set of resonators comprising a plurality of resonators having the same or substantially similar fundamental resonant frequency.

10. The frequency converter of claim 1, wherein a single input signal is provided at the input.

11. The frequency converter of claim 1, wherein the transmission line includes filter means arranged to remove unwanted harmonics.

12. The frequency converter of claim 1, wherein the medium comprises a superconducting structure.

13. The frequency converter of claim 12, wherein the medium comprises a plurality of superconducting tunnelling structures embedded along the transmission line.

14. The frequency converter of claim 13, wherein the superconducting tunnelling structures have a critical frequency above which they are not superconducting, wherein the critical frequency is approximately an order of magnitude or more higher than the one or more frequencies.

15. The frequency converter of claim 1, wherein the current of the input signal at the input is arranged such that the amplitude of the one or more harmonics at the output is greater than the amplitude of the input signal.

16. A frequency converter comprising:
   a first input for receiving an input signal;
   a first transmission line formed of a non-linear medium, the medium arranged such that when the input signal propagates along the line, one or more harmonics of the input signal are generated;
   a plurality of first dispersion control elements, the first dispersion control elements arranged to control the dispersion relationship of the medium, to phase match the input signal and the one or more harmonics, such that energy is transferred from the input signal to the one or more harmonics;

a first output for providing the one or more harmonics as an output signal, the output signal having a different frequency that the input signal;

a second transmission line formed of a non-linear medium, the second transmission line having a second input for receiving the output signal from the first output as an input signal;

a plurality of second dispersion control elements, the second dispersion control elements arranged to control the dispersion relationship of the medium of the second transmission line, to phase match two or more signals propagating down the second transmission line; and a second output for providing one or more signals as an output.

17. A method of generating an output signal from an input signal, the output signal having different frequency than the input signal, the method including:

providing an input signal;

propagating the signal down a transmission line formed of a non-linear medium, the medium arranged such that when the input signal propagates along the line, one or more harmonics of the input signal are generated;

phase matching the input signal and the one or more harmonics, such that energy is transferred from the input signal to the one or more harmonics; and providing the one or more harmonics as an output signal, wherein the output signal comprises one or more integer multiple harmonics of the input signal or one or more sub-harmonics of the input signal, such that the frequency converter is a down converter.

18. A frequency converter for generating an output signal from an input signal, the output signal having different frequency than the input signal, the frequency converter including:

an input for receiving an input signal;

a transmission line formed of a non-linear medium, the medium arranged such that when the input signal propagates along the line, one or more harmonics of the input signal are generated;

a plurality of dispersion control elements, the dispersion control elements arranged to control the dispersion relationship of the medium, to phase match the input signal and the one or more harmonics, such that energy is transferred from the input signal to the one or more harmonics; and an output for providing the one or more harmonics as an output signal, wherein the output signal comprises one or more sub-harmonics of the input signal, such that the frequency converter is a down converter.

19. The frequency converter of claim 18, wherein the input signal and the one or more harmonics are phase matched such that the phase difference between the signals is kept at zero or substantially zero.

20. The frequency converter of claim 19, wherein the input signal and the one or more harmonics are phase matched when the frequency of the input signal is substantially at a first frequency or a second frequency.

* * * * *